(12) United States Patent
Samuels

(10) Patent No.: US 12,080,530 B2
(45) Date of Patent: Sep. 3, 2024

(54) MODEL REFERENCE ADAPTIVE CONTROL WITH SIGNUM PROJECTION TENSOR OPERATIONS

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc, Denver, CO (US)

( * ) Notice: Subject to any disclaimer, the term of this patent is extended or adjusted under 35 U.S.C. 154(b) by 379 days.

(21) Appl. No.: 17/473,519

(22) Filed: Sep. 13, 2021

(65) Prior Publication Data

US 2023/0080707 A1    Mar. 16, 2023

(51) Int. Cl.
| | | |
|---|---|---|
| *H01J 37/32* | (2006.01) | |
| *G05B 6/02* | (2006.01) | |
| *G05B 13/04* | (2006.01) | |

(52) U.S. Cl.
CPC .......... *H01J 37/32926* (2013.01); *G05B 6/02* (2013.01); *G05B 13/042* (2013.01); *H01J 37/32183* (2013.01); *H01J 37/32935* (2013.01)

(58) Field of Classification Search
CPC ... G05B 13/042; G05B 6/02; H01J 37/32935; H01J 37/32926; H01J 37/32183
See application file for complete search history.

(56) References Cited

U.S. PATENT DOCUMENTS

| | | | |
|---|---|---|---|
| 8,040,068 B2 | 10/2011 | Coumou | |
| 8,258,874 B2 | 9/2012 | van Zyl | |
| 8,576,013 B2 * | 11/2013 | Coumou | H03F 1/32 330/305 |
| 8,716,984 B2 | 5/2014 | Mueller | |
| 8,781,415 B1 * | 7/2014 | Coumou | H01J 37/32935 330/149 |
| 8,912,835 B2 | 12/2014 | Nagarkatti | |
| 9,225,299 B2 | 12/2015 | van Zyl | |
| 9,721,758 B2 * | 8/2017 | Coumou | H01J 37/32174 |
| 10,049,857 B2 | 8/2018 | Fisk, II | |
| 10,741,363 B1 * | 8/2020 | Burry | H01J 37/32155 |
| 11,042,140 B2 | 6/2021 | Coumou et al. | |
| 2013/0169359 A1 * | 7/2013 | Coumou | H03F 3/191 330/192 |

(Continued)

OTHER PUBLICATIONS

PCT, International Preliminary Report on Patentability issued in PCT/US2022/043329, Mar. 28, 2024, 9 pages.

*Primary Examiner* — Vincent H Tran
(74) *Attorney, Agent, or Firm* — Neugeboren O'Dowd PC

(57) ABSTRACT

An example device comprises a reference model module, an adaptation law module, and an adaptive control module. The reference model module is configured to receive a setpoint input and a reference model input, and to generate a reference model output. The adaptation law module is configured to receive the reference model output from the reference model module, to perform a signum projection tensor operation based at least in part on the reference model output, and to generate a signum projection adaptation law output. The adaptive control module is configured to receive the adaptation law output from the adaptation law module, to receive the setpoint input, and to receive a sensor system output from a sensor system, and to generate an adaptive control signal.

20 Claims, 8 Drawing Sheets

(56) References Cited

U.S. PATENT DOCUMENTS

| | | | |
|---|---|---|---|
| 2013/0222055 A1* | 8/2013 | Coumou | H03F 1/0233 330/75 |
| 2014/0224767 A1* | 8/2014 | Merry | C23C 14/54 156/345.24 |
| 2014/0251967 A1* | 9/2014 | Peters | B23K 9/091 219/130.21 |
| 2016/0163514 A1* | 6/2016 | Fisk, II | H01J 37/32174 315/111.21 |
| 2019/0391547 A1* | 12/2019 | Coumou | H01J 37/32165 |
| 2022/0165545 A1* | 5/2022 | Burry | H01J 37/32082 |
| 2023/0041177 A1* | 2/2023 | Smyka | H01J 37/32183 |

\* cited by examiner

MODEL REFERENCE ADAPTIVE CONTROL WITH SIGNUM PROJECTION TENSOR OPERATIONS

TECHNICAL FIELD

Aspects of the present disclosure relate generally to control systems, including control systems for radio frequency (RF) generators.

BACKGROUND

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma applications.

After substantial technological progress, one typical plasma power and control system may comprise an inductively coupled plasma (ICP) reactor, powered by an RF generator connected through an RF impedance match network, and accompanied by measurement equipment that detects signals and physical states from the match network and the plasma reactor and feeds that data to the RF generator. The match network implements rapid, high-precision matching of the rapidly changing, chaotic, nonlinear impedance of the plasma, to protect the RF generator from the otherwise deleterious effects of those rapid, nonlinear impedance changes. The RF generator amplifies and converts electrical power from a basic input form into a form optimized to power the plasma. The RF generator comprises an RF power amplifier, a user interface, and a controller, such as a measurement and control multi-processor system on chip (M&C MPSoC), which controls the RF generator.

SUMMARY

Aspects of this disclosure are based on novel insights for designs of next generation control systems, with applications including for RF generators to power plasma processing systems, for example. Novel RF generator control systems of this disclosure may enable novel advances beyond aspects of the pre-existing state of the art, such that, with the benefit of hindsight from insights and aspects of the present inventive disclosure, various aspects of pre-existing prior art state of the art control systems can now be appreciated as constraints and limitations. As particular examples, various aspects disclosed herein pertain to multiple-input, multiple-output (MIMO) model reference adaptive control (MRAC) control systems, devices, and methods incorporating a digital twin model reference, signum operations and projection operations, one or multiple proportional-integral-derivative (PID) control modules and/or other types of control modules, and a hysteresis-based sliding mode filter in combination with such other aspects, among various related systems, devices, and methods of this disclosure. Novel RF generator control systems of this disclosure may enable new advances in consistency and precision of control in plasma processing, in accordance with various aspects of this disclosure. Applications of aspects of this disclosure may comprise advanced, rapid, high-precision, robust control of radio frequency (RF) generators and plasma chambers, for example.

Various illustrative aspects are directed to a device that comprises a reference model module, an adaptation law module, and an adaptive control module. The reference model module is configured to receive a setpoint input and a reference model input, and to generate a reference model output based at least in part on the setpoint input and the reference model input. The adaptation law module is configured to receive the reference model output from the reference model module, to perform a signum projection tensor operation based at least in part on the reference model output, and to generate a signum projection adaptation law output, based at least in part on the signum projection tensor operation. The adaptive control module is configured to receive the adaptation law output from the adaptation law module, to receive the setpoint input, and to receive a sensor system output from a sensor system, and to generate an adaptive control signal based at least in part on the adaptation law output, the setpoint input, and the sensor system output.

Various illustrative aspects are directed to a method. The method comprises receiving, by a control device, a setpoint input and a reference model input, and generating a reference model output, based at least in part on the setpoint input and the reference model input. The method further comprises receiving, by the control device, the reference model output, performing a signum projection tensor operation based at least in part on the reference model output, and generating a signum projection adaptation law output, based at least in part on the signum projection tensor operation. The method further comprises receiving, by the control device, the adaptation law output from the adaptation law module, receiving the setpoint input, and receiving a sensor system output from a sensor system, and generating an adaptive control signal based at least in part on the adaptation law output, the setpoint input, and the sensor system output.

Various illustrative aspects are directed to a computing system. The computing system comprises one or more processing devices, one or more tangible computer-readable memory devices, and one or more tangible computer-readable data storage devices. The computing system further comprises program instructions, stored on the one or more data storage devices for execution by the one or more processing devices using the one or more memory devices, for receiving, by a control device, a setpoint input and a reference model input, and generating a reference model output, based at least in part on the setpoint input and the reference model input. The computing system further comprises program instructions, stored on the one or more data storage devices for execution by the one or more processing devices using the one or more memory devices, for receiving, by the control device, the reference model output, performing a signum projection tensor operation based at least in part on the reference model output, and generating a signum projection adaptation law output, based at least in part on the signum projection tensor operation. The computing system further comprises program instructions, stored on the one or more data storage devices for execution by the one or more processing devices using the one or more memory devices, for receiving, by the control device, the adaptation law output from the adaptation law module, receiving the setpoint input, and receiving a sensor system output from a sensor system, and generating an adaptive control signal based at least in part on the adaptation law output, the setpoint input, and the sensor system output.

Various further aspects are depicted in the accompanying figures and described below, and will be further apparent based thereon.

BRIEF DESCRIPTION OF THE DRAWINGS

Various features and advantages of the technology of the present disclosure will be apparent from the following description of particular examples of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative examples of the present disclosure and are not to be considered limiting in scope.

DETAILED DESCRIPTION

Aspects of the present disclosure may provide novel, next generation control systems, including signum projection adaptation law control systems, devices, and methods. In various aspects disclosed herein, various examples may comprise multiple-input, multiple-output (MIMO) model reference adaptive control (MRAC) control systems, devices, and methods incorporating a digital twin model reference, signum operations and projection operations, one or multiple proportional-integral-derivative (PID) control modules and/or other types of control modules, and a hysteresis-based sliding mode filter in combination with such other aspects, among various related systems, devices, and methods of this disclosure.

Figure 1:
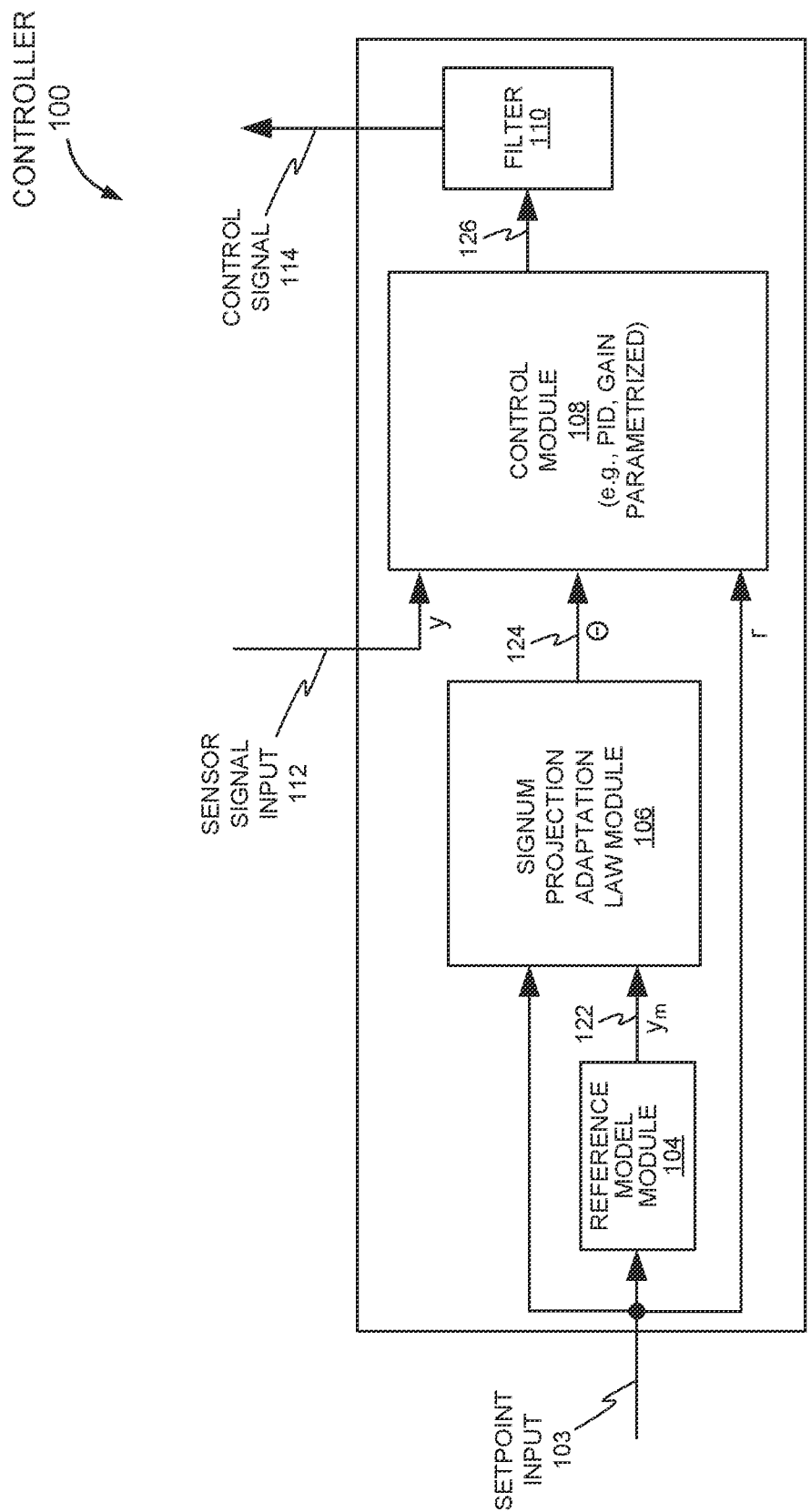
FIG. 1 illustrates a controller in accordance with aspects of the present disclosure.

FIG. 1 illustrates a controller 100 in accordance with illustrative aspects of this disclosure. Controller 100 may be a signum projection adaptation law controller, that is, a controller that performs a signum projection parameter tensor estimator operation in a model reference adaptive control system, as explained herein, in accordance with illustrative aspects. Controller 100 is configured to receive setpoint input 103 and sensor signal input 112, and to output a control signal 114. Setpoint input 103 may comprise one or more desired setpoints, and digital twin reference model parameters, in this example. Controller 100 comprises a reference model module 104, signum projection adaptation law module 106, control module 108, and filter 110. Reference model module 104, signum projection adaptation law module 106, and control module 108 may all be configured to receive the setpoint input 103, in this example.

Reference model module 104 may comprise any kind of reference model or reference shaped waveform in different examples. So, while reference model module 104 and other reference models in this disclosure refer to "reference models," they are not limited by conventional notions of what may constitute a reference model, but may also include any type of reference shaped waveform, in various examples. Reference model module 104 may be a digital twin reference model, in some examples. Reference model module 104 may incorporate selected setpoint parameters and digital twin parameters, from among the setpoint input 103, as explained further below. Setpoint input 103 may be received from a user interface, or other user system, in different examples. Reference model module 104 may model an external system to be controlled, and how such external system interacts with the selected setpoint parameters from setpoint input 103. Reference model module 104 may generate a reference model output 122 based on its modeling, and output reference model output 122 to signum projection adaptation law module 106 ("SPAL module 106"), in this example.

Signum projection adaptation law module 106 may receive the reference model output 122 from reference model module 104 and the selected setpoint parameters from setpoint input 103. Signum projection adaptation law module 106 may perform a signum projection parameter tensor estimator operation on the inputs it receives. That is, signum projection adaptation law module 106 may perform a calculation of a parameter tensor, where the calculation comprises signum projection adaptation law module 106 multiplying a gain tensor by one or more signum terms based at least in part on the reference model module 104 and the selected setpoint parameters from setpoint input 103, and then performing a projection operation on the result, in various examples. The performing of a signum projection parameter tensor operation by signum projection adaptation law module 106 in accordance with various aspects is further explained below. Signum projection adaptation law module 106 may also perform other functions, such as comparing the reference model output from reference model module 104 and the selected setpoint parameters from setpoint input 103, determining and correcting for any error apparent between the two, applying an adaptive gain scaling tensor operation, and/or other processing operations, in different examples, as explained further below. Signum projection adaptation law module 106 may generate a signum projection parameter tensor output 124 as a result of its operations, and may output signum projection parameter tensor output 124 to control module 108, in this example.

Control module 108 may receive the selected setpoint parameters from setpoint input 103, the signum projection tensor output 124 from signum projection adaptation law module 106, and sensor signal input 112 from an external sensor system detecting one or more aspects of an external system to be controlled, in this example. Control module 108 may be, e.g., a PID control module, a gain parametrized control module, or other type of control module, in different examples. Control module 108 may compare the signum projection tensor output 124 from signum projection adaptation law module 106, the sensor signal input 112, and the selected setpoint parameters from setpoint input 103, and may detect for any error in the sensor signal input 112 relative to the signum projection tensor output 124 and/or the setpoint parameters from setpoint input 103. Control module 108 may apply one or more correction operations for any such detected error, among various operations it may perform. As the end result of such operations, control module 108 may generate a control output 126, and may output the control output 126 to filter 110. Control module 108 may be an adaptive control module, or any type of control module, in different examples.

As a note on terminology, persons skilled in the relevant fields of art may recognize that while controller 100 may typically be referred to in systems engineering as a "controller", in control engineering, controller 100 may also sometimes be referred to as a "control system" while control module 108 may sometimes be referred to as a "controller." While these conventions may be kept in mind and may be used in the alternative, in accordance with different accepted naming conventions in the relevant fields of art, for purposes of the remainder of this disclosure, controller 100 and control module 108 and analogous controllers and control modules of the present disclosure will be referred to as "controllers" and "control modules" respectively.

Filter 110 may be a sliding mode filter in some examples, and may further be a hysteresis-based sliding mode filter, in some examples. Filter 110 may perform a hysteresis-based sliding mode filter operation on control output 126, in this example. In other words, filter 110 may perform a sliding mode filter operation that also accounts for hysteresis in the changes of control output 126, and may filter out any changes in control output 126 that are particularly small or incremental from one time step to the next, and may eliminate any potential chatter in control output 126, for example. Sliding mode control allows carrying robust and high performance control on a nonlinear system. However, this may cause chattering around the setpoint value. Filter 110 may fix this chattering issue by using hysteresis on the sliding mode filter to minimize and remove chattering, while maintaining the desired performance and robustness of the sliding mode output filter. Filter 110 may then generate and output a control signal 114 based on its filter operations. Filter 110 may thus be configured to receive an adaptive control signal from control module 108, which may comprise an adaptive control module, and to generate a filtered control signal 114 based at least in part on the adaptive control signal.

Controller 100 may be configured to output the control signal 114 to an external destination, such as a system to be controlled by controller 100, which may comprise the same system that is modeled by reference model module 104, and from which sensor signal input 112 is received, in this example, and as further described below.

Reference model module 104, signum projection adaptation law module 106, control module 108, and/or filter 110 may each be implemented in whole or in part as functional blocks of electronic hardware, as files or portions of one or more files of software executed on a general-purpose computer, a cloud computing environment, or other processing hardware, or in any other combination of processing hardware and/or software configured to perform the functions described, in various aspects. In some examples, reference model module 104, signum projection adaptation law module 106, control module 108, and/or filter 110 may be implemented on a single measurement and control multiprocessor system on chip (M&C MPSoC). In some examples, reference model module 104, signum projection adaptation law module 106, control module 108, and/or filter 110 may be implemented on a single M&C MPSoC in combination with one or more GPUs. In some examples, reference model module 104, signum projection adaptation law module 106, control module 108, and/or filter 110 may be implemented on another type of single system on chip (SoC), a field-programmable gate array (FPGA), an FPGA combined with a graphics processing unit (GPU), a combination of one or more SoCs, FPGAs, GPUs, and/or one or more central processing units (CPUs), and/or one or more other processing devices, or other combinations of hardware and/or software.

Controller 100 may be used or incorporated in any of a wide variety of applications, technologies, and industries. For example, controller 100 may be applied in plasma applications, semiconductor processing and other materials processing, robotics, vehicle control systems for automobiles, aircraft, and spacecraft, other electronic, manufacturing, and industrial systems, and other applications and technologies, in different examples.

Figure 2:
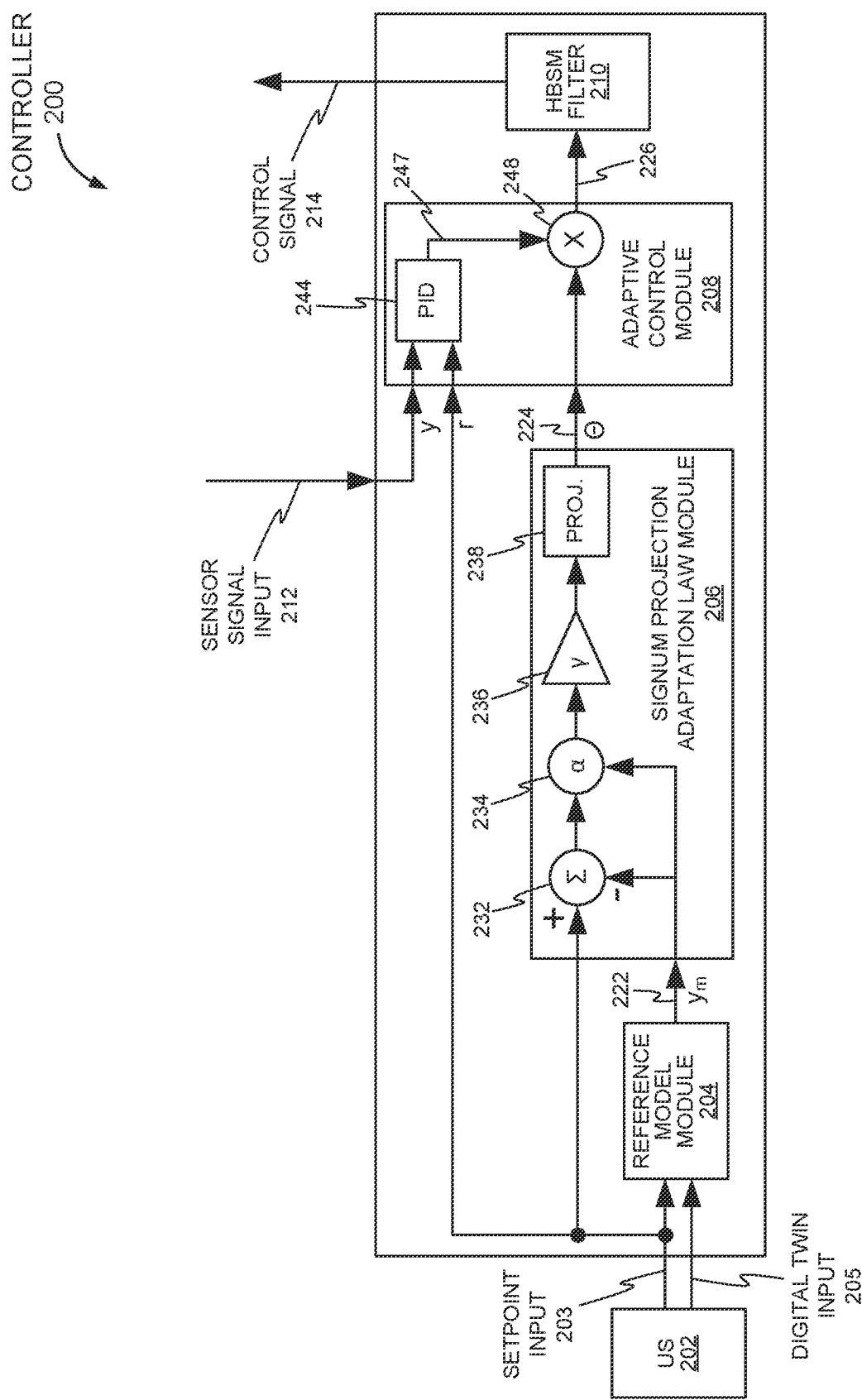
FIG. 2 illustrates a controller in accordance with aspects of the present disclosure.

FIG. 2 illustrates a controller 200, analogous in some respects to controller 100 and with some analogous modules and components, and that shows some additional detail in accordance with illustrative aspects of this disclosure. Controller 200 may be a signum projection adaptation law controller. Controller 200 comprises a reference model module 204, a signum projection adaptation law module 206 ("SPAL module 206"), an adaptive control module 208, and a hysteresis-based sliding mode filter 210 ("HBSM filter 210"). Controller 200 may be configured to receive setpoint input 203, which may comprise selected setpoint parameters, and digital twin input 205, which may comprise selected digital twin parameters, from a user system (US) 202, in this example. User system 202 may comprise a setpoint control user interface or other user interface, one or more computers, one or more processing devices, a computing environment, and/or other system accessible to a user, which may be considered a user system, for performing functions comprising one or more functions as described herein. User system 202 may comprise both a setpoint control user interface device, and one or more general purpose computing devices and/or computing environments for storing, processing, and executing a digital twin or other type of model reference that reproduces the functions of a target system to be controlled in high precision in software, in some examples. Controller 200 may also be configured to receive sensor signal input 212 from an external source, and to output a control signal 214 to a system to be controlled, which may comprise or be associated with the source or sources of sensor signal input 212. Reference model module 204 may all be configured to receive setpoint input 203 and digital twin input 205, while signum projection adaptation law module 206 and adaptive control module 208 may be configured to receive setpoint input 203, in this example.

Reference model module 204 may be a digital twin reference model, and may incorporate selected setpoint parameters from setpoint input 203 and digital twin parameters from digital twin input 205. Analogously in some ways to controller 100, reference model module 204 may generate a reference model output 222 and output reference model output 222 to signum projection adaptation law module 206, in this example. Signum projection adaptation law module 206 may receive the reference model output 222 from reference model module 204 and the setpoint input 203 and may generate and output a signum projection tensor output 224 to adaptive control module 208, as explained further below. Adaptive control module 208 may receive setpoint input 203, the signum projection tensor output 224 from signum projection adaptation law module 206, and sensor signal input 212 from an external sensor system, and may generate and output an adaptive control output 226 to hysteresis-based sliding mode filter 210. By performing its operations and generating its outputs in part based on sensor signal input 212 from an external sensor system, adaptive control module 208 may adapt and update its outputs during operation of the external system based on measured performance of the external system, in this example. Hysteresis-based sliding mode filter 210 may receive adaptive control output 226, and generate and output control signal 214. Reference model module 204, signum projection adaptation law module 206, adaptive control module 208, and hysteresis-based sliding mode filter 210 are further described as follows.

Reference model module 204 may perform modeling of a system to be controlled by controller 200. Reference model module 204 may incorporate and use a digital twin or other reference model of such a system to be controlled. Further detail of reference model modules are described further below, with reference to specific example systems to be controlled by controllers of this disclosure.

Signum projection adaptation law module 206 comprises summation module 232, alpha module 234, gamma adaptive gain scaling module 236, and signum projection tensor module 238 in this example, as shown in FIG. 2, example functions of which are described as follows. Summation module 232 receives setpoint input 203 from user system (US) 202, and reference model module output 222 from reference model module 204, and compares these two inputs to detect and output any detected error between the two as a measured error signal, to alpha module 234. Alpha module 234 may create a linearly saturating signum function that can be used to pre-emptively reduce any chattering that might otherwise occur in downstream signum operations in controller 200. For example, the output of alpha module 234 may be $\{-3, -2, -1, 0, 1, 2, 3\}$ if the error is between $\{-6000, -3000, -1000, 0, 1000, 1200, 4000, 6000\}$, whereas the signum operator may have an output of $\{-1, 0, 1\}$ based solely on the sign. Alpha can be considered as a sign gradient. Alpha module 234 receives the measured error signal from summation module 232 and the reference model module output 222 from reference model module 204, and generates an output to adaptive gain scaling module 236. Adaptive gain scaling module 236 performs an adaptive gain scaling on its input, and generates the resulting output to signum projection tensor module 238. Signum projection tensor module 238 receives this input and performs an on-line signum tensor parameter projection tensor operation on the input, and generates the result as signum projection parameter tensor output 224. The signum projection tensor operation performed by signum projection tensor module 238 may be implemented as set forth in Equations 1-3:

$$\Delta(e/\Theta)_k = \frac{e_k - e_{k-1}}{\Theta_k - \Theta_{k-1}} \quad \text{(Equation 1)}$$

$$\Theta_{k+1} = Proj\left\{-\Gamma_k * \text{signum}\left(\frac{e_k - e_{k-1}}{\Theta_k - \Theta_{k-1}}\right) * \text{signum}(e_k)\right\} \quad \text{(Equation 2)}$$

$$\Theta_{k+1} = Proj\left\{-\Gamma_k * \text{signum}\left(\Delta(e/\Theta)_k\right) * \text{signum}(e_k)\right\} \quad \text{(Equation 3)}$$

wherein $\Theta_{k+1}$ comprises a signum projection adaptation law MIMO tensor output for a time k+1, $\Theta_k$ comprises a signum projection adaptation law MIMO tensor output for a time k prior to the time k+1, $\Theta_{k-1}$ comprises a signum projection adaptation law MIMO tensor output for a time k−1 prior to the time k, $\Gamma_k$ comprises an adaptive gain scaling learning factor tensor for the time k, $e_k$ comprises a MIMO tensor error signal for the time k based at least in part on a detected error between the reference model output and the setpoint input for the time k, $e_{k-1}$ comprises a MIMO tensor error signal for the time k−1 based at least in part on a detected error between the reference model output and the setpoint input for the time k−1, and the projection operator Proj performs a tensor projection operation. By performing operations on MIMO tensors, signum projection adaptation law module 206 may be much more generalized and higher performing than conventional techniques and systems of the prior art.

That is, at each time index k, the signum projection tensor module 238 computes a an error MIMO tensor signal e at time index k minus the MIMO tensor error signal e at the previous time index k−1, which may be referred to as $\Delta e_k$, divided by the theta MIMO parameter tensor $\Theta$ at time index k minus the theta MIMO parameter tensor $\Theta$ at the previous time index k−1, which may be referred to as $\Delta \Theta_k$; the result of this division may be referred to as $\Delta(e/\Theta)_k$ (Equation 1). At each time index k, the signum projection tensor module 238 further computes a negative adaptive gain scaling learning factor tensor gamma, $\Gamma$, times a signum of $\Delta(e/\Theta)_k$ times a signum of error signal e at time index k, and then performs a projection operation (Proj) on the result (as in Equation 2, and in slightly simplified form in equivalent Equation 3), with the result of the computation being a new theta signum projection parameter tensor output 224, $\Theta$, for new time index k+1, i.e., $\Theta_{k+1}$. Signum projection tensor module 238 outputs the theta signum projection parameter tensor output 224 as the output of signum projection adaptation law module 206 to adaptive control module 208.

Thus, signum projection adaptation law module 206 comprises signum projection tensor module 238 configured to perform a signum projection tensor operation on an input based at least in part on the reference model output, wherein the signum projection adaptation law output is based at least in part on the signum projection tensor operation. Performing the signum projection tensor operation may comprise performing a determination of a signum projection adaptation law output for a time k+1 in a form of Equation 2 listed above.

The tensor projection operator may be implemented as follows, in some examples:

$$Proj(\Theta, Y, F) = [Proj(\theta_1, y_1, f_1) \ldots Proj(\theta_m, y_m, f_m)] \quad \text{(Equation 4)}$$

$$Proj(\theta_j, y_j, f_j) =$$

$$\begin{cases} y_j - \frac{\nabla f_j(\theta_j)(\nabla f_j(\theta_j))^T}{\|\nabla f_j(\theta_j)\|^2} y_j f_j(\theta_j) & \text{if } f_j(\theta_j) > 0 \wedge y_j^T \nabla f_j(\theta_j) > 0 \\ y_j & \text{otherwise} \end{cases}$$

$j = 1$ to $m$ (Equation 5)

The theta signum projection parameter tensor output 224 generated by signum projection adaptation law module 206 may represent a nonlinear, time-varying, multiple-input multiple-output (MIMO) parameter tensor. Some aspects of example controller 200 may be further appreciated in contrast to certain prior art systems. For example, it has sometimes been considered conventional wisdom in the prior art that simplifications such as linearity, time invariance, and single-input single-output (SISO) modeling are important or necessary to implement control systems tractably or feasibly; on the other hand, various aspects of the present disclosure may incorporate the novel insight that an example controller 200 may incorporate a signum projection adaptation law module 206 that may generate a nonlinear, time-varying, multiple-input multiple-output (MIMO) signum projection parameter tensor, and not only form a tractable system to implement but that may also pose insuperable advantages over the prior art, including guaranteed stability and high performance, among various other advantages in various examples. As another example, certain prior art systems incorporate a component known as an integrator, while various aspects of the present disclosure may incorporate the novel insight that a signum projection adaptation law module 206 as in example controller 200 may transcend the functioning of a prior art integrator, and the novel insight that prior art integrators and systems may allow parameters to drift away outside of an applicable region of stability, whereas a signum projection adaptation law module 206 as in example controller 200, generating a nonlinear, time-varying, multiple-input multiple-output (MIMO) theta signum projection parameter tensor output 224, may provide guaranteed assurance of parameter stability, may provide mission assurance of always counteracting parameter drift to maintain parameters within the bounds of stability, and may thus thereby guarantee stability and high performance of the controller 200, and guarantee bounded parameter estimates without trying to rely on parameter leakage to address potential parameter drift, among various additional advantages.

Signum projection adaptation law module 206 is also capable of operating at very fast speeds, relative to prior art systems, and may be controlled to repeat its processing operations repeatedly as rapidly as possible, thereby approaching or achieving real-time reaction speeds relative to the equipment or plant to be controlled, in various examples, among other advantages. This real-time processing reaction speed may be in sharp contrast to many typical or conventional-wisdom prior art systems, in which processing rates may not be capable of real-time performance, and in which high processing speeds are avoided as undesirable, as likely to inject to much or too rapid of changes in an outputted control signal—drawbacks that are avoided and resolved by controller 200 in various examples of this disclosure, as further described below. Controller 200 of this disclosure in various examples may also thus avoid averaging over time, a common technique in prior art systems to try to compensate for rapid, nonlinear changes in conditions over extremely short periods of time, but which also typically introduces additional difficulties and failure modes in many prior art systems.

Thus, instead of relying on parameter leakage to address potential parameter drift and guarantee bounded parameter estimates, as in certain prior art systems, signum projection adaptation law module 206 may adjust an adaptation rate with a signum tensor operation with tensor parameter projection at a very high adaptation rate, e.g., at the fastest rate possible or feasible with its applicable processing hardware (e.g., an FPGA), which may ensure bounds on uncertainty and which may ensure stability. Signum projection adaptation law module 206 may thus generate and output theta signum projection parameter tensor output 224 to adaptive control module 208. Adaptive control module 208 may also receive setpoint input 203 from US 202, and sensor signal input 212 from one or more external sensors configured to detect measurements of an external system to be controlled by controller 200. In this example, adaptive control module 208 comprises a proportional-integral-derivative (PID) module 244, and a multiplication module 248. Adaptive control module 208 comprises a single PID module 244 in this example, and may comprise any number of PID modules in other examples, with mutual feedback among multiple PID modules in accordance with various arrangements, and/or additional architecture and modules associated with multiple PID modules, in various examples.

Thus, while signum projection adaptation law module 206 may be referred to as an adaptation law module, with reference to that term as it is understood in the relevant field of art, signum projection adaptation law module 206 also transcends the typical function of an adaptation law module. Signum projection adaptation law module 206 may in some ways be conceptualized as a novel form of pre-filter as opposed to a type of adaptation law module as conventionally understood, one which pre-filters the applicable signals based on the signum of the magnitude of the delta. Signum projection adaptation law module 206 may also determine gamma in real-time using optimization procedures to find best values for gamma, and perform signum calculations without needing to perform any division calculations in some examples, by transforming the division term of Equation 2 into a multiplication of a signum of the delta of the $e_k$ parameter tensors by a signum of the delta of the $\Theta_k$ parameter tensors, thereby substantially optimizing for calculation speed and efficiency. For example, Equation 2 may be transformed into the following Equation 6, which signum projection adaptation law module 206 may execute:

$$\Theta_{k+1} = \text{Proj}\{-\Gamma_k * \text{signum}(e_k - e_{k-1}) * \text{signum}(\Theta_k - \Theta_{k-1}) * \text{signum}(e_k)\} \quad \text{(Equation 6)}$$

Other examples may comprise other types of control modules that may not comprise PID modules. Some examples may comprise a gain scheduling control module and/or an H-infinity control module in place of or in addition to one or more PID control modules, and in some examples, may perform linear gain scheduling based on an H-infinity determination. While such modules may all generically be comprised within the umbrella term of an adaptive control module for purposes of this disclosure, some such modules may alternatively be considered as gain scheduled control modules. Gain scheduled adaptive control modules comprised in various examples of this disclosure may perform gain scheduling calculations in state space and/or in parallel, thereby promoting speed and efficiency of calculation performance, in various examples.

In the example of FIG. 2, PID module 244 receives setpoint input 203 and sensor signal input 212, performs a PID operation on setpoint input 203 and sensor signal input 212, and generates a PID output 247. PID module 244 outputs PID output 247 to multiplication module 248. Multiplication module 248 also receives theta signum projection parameter tensor output 224 from signum projection adaptation law module 206. Multiplication module 246 may multiply theta signum projection parameter tensor output 224 by PID output 247, and thereby generate a resulting adaptive control output 226. Adaptive control module 208 may repeatedly re-calculate a new product of theta signum projection parameter tensor output 224 and PID output 247 repeatedly at a speed limit of its processing hardware, and not have to rely on any averaging over time, which may provide further novel advantage over prior art systems. Adaptive control module 208 may thus generate and output adaptive control output 226 to hysteresis-based sliding mode (HBSM) filter 210 in this example.

Hysteresis-based sliding mode filter 210 receives adaptive control output 226 and performs hysteresis-based sliding mode filtering of adaptive control output 226. Hysteresis-based sliding mode filter 210 only allows changes to control signal 214 if adaptive control output 226 is different than a prior time-indexed adaptive control output by more than a sliding mode limit, potentially after correcting for hysteresis, and screens out changes to adaptive control output 226 that fall below this hysteresis-based sliding mode limit. Hysteresis-based sliding mode filter 210 may thus be considered a quantizing filter which removes chatter, and/or removes very small uncertainties, and very small changes which may typically be of the order of scale of system uncertainties, or noise over signal. Hysteresis-based sliding mode filter 210 may thus contribute to preventing small, unjustified, noisy oscillations or variations in control signal 214 as outputted by controller 200. Hysteresis-based sliding mode filter 210 may thus contribute to ensuring robustness and stability of the generated control signal, including with respect to hardware quantization or discretization effects. By being disposed as the final component of controller 200 in contrast to potentially being disposed earlier in the chain of components, controller 200 is able to maintain the greatest possible available information, and calculate based on the greatest possible available information, in performing its operations up through generating adaptive control output 226, before subjecting adaptive control output 226 to hysteresis-based sliding mode filter 210.

By its nature, hysteresis-based sliding mode filter 210 is also inherently capable of very fast processing speeds, thus contributing to the overall very fast processing speeds of controller 200, relative to prior art systems, in this example, among other advantages. Hysteresis-based sliding mode filter 210 may also thus help enable the benefits of signum projection adaptation law module 206 operating very rapidly and potentially approaching or achieving real-time reaction processing, while hysteresis-based sliding mode filter 210 may help ensure that control signal 214 isn't changed too rapidly as a result. In other words, the combination of components in controller 200 in this example may ensure an optimum combination of real-time reaction processing speeds while maintaining robust adaptive performance at such high processing speeds, thereby delivering the benefits of such high speeds without potential drawbacks that accompany attempts at high reaction processing speeds in prior art systems.

Controller 200 may thus output the control signal 214 as generated by reference model module 204, signum projection adaptation law module 206, adaptive control module 208, and hysteresis-based sliding mode filter 210 and as finally outputted by hysteresis-based sliding mode filter 210. Controller 200 may be disposed in connection with any of a wide variety of systems to be controlled and configured to output control signal 214 to such systems to implement very fast, high-precision, robust, adaptive control of such systems. An example of such control of such an external system is shown in FIG. 3.

Figure 3:
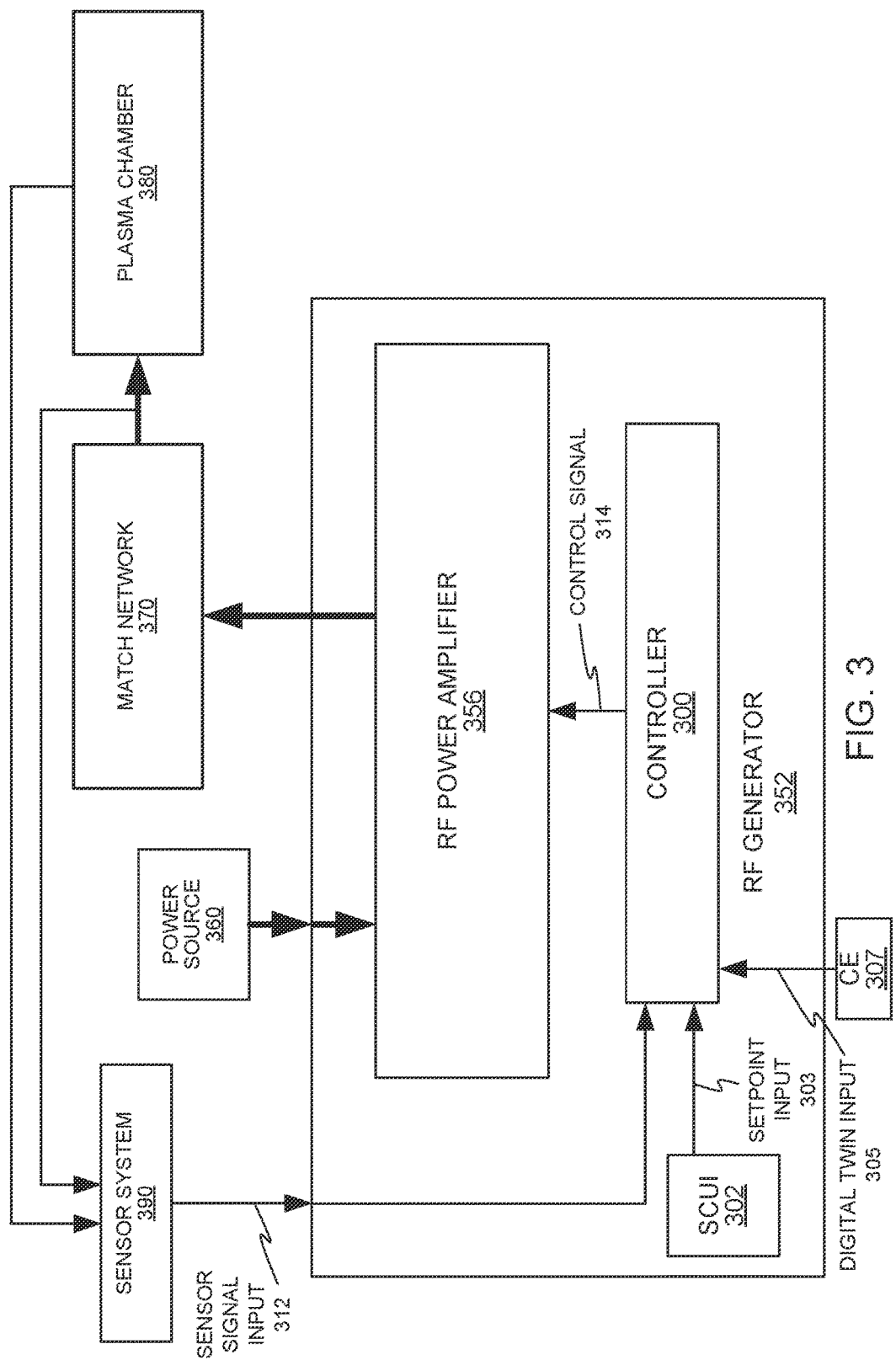
FIG. 3 illustrates a plasma processing environment comprising a radio frequency (RF) generator that incorporates a controller, in accordance with aspects of the present disclosure.

FIG. 3 shows a plasma processing environment 301 comprising a radio frequency (RF) generator 352 that incorporates a controller 300 of this disclosure, in accordance with an illustrative example. Plasma processing environment 301 is one illustrative application context among many in which a controller of this disclosure may be advantageously incorporated, to implement novel forms of robust, adaptive control to complex systems. Plasma processing environment 301 comprises RF generator 352, computing environment (CE) 307, power source 360, match network 370, plasma chamber 380, and sensor system 390, in this example. RF generator 352 comprises an RF power amplifier 356, a controller 300, and a setpoint control user interface (SCUI) 302, in this example. Setpoint control user interface 302, computing environment 307, and sensor system 390 are all configured to generate outputs that are configured to be received as inputs by controller 300. Controller 300 may be configured to perform, execute, implement, or embody signum projection adaptation law control of plasma processing environment 301, as outputted, implemented, or expressed in a control signal 314, as described herein.

Controller 300 may be implemented to comprise a measurement and control (M&C) multi-processor system on chip (MPSoC), in some examples. Controller 300 is configured to control RF power amplifier 356 via control signal 314. Control signal 314 may comprise a signum projection adaptation law control signal, and may incorporate the results of signum projection adaptation law implementations, techniques, and methods in accordance with examples of this disclosure.

RF power amplifier 356 is configured to receive electrical power from power source 360, and to receive and be controlled by control signal 314 from controller 300. RF power amplifier 356 may be configured and implemented in any of various complex designs, which may be adapted to address complex sets of performance requirements and specifications of various plasma chambers or other systems, in accordance with different applications. Further description of example applicable RF power amplifiers is found in various additional disclosures by the present applicant. RF power amplifier 356 powers plasma chamber 380, through the intermediary of match network 370. Plasma chamber 380 may be an inductively coupled plasma (ICP) reactor or other type of plasma processing chamber used for semiconductor processing or other advanced materials processing, in some examples.

Match network 370 provides high-speed, precise impedance matching with the load impedance of plasma chamber 380, as the impedance of plasma chamber 380 varies erratically and nonlinearly on very short time scales, due to the often chaotic behavior of plasmas being generated and manipulated therein. Match network 370 thereby protects RF power amplifier 356 from otherwise deleterious effects of rapid, chaotic variations and shocks in the load impedance of plasma chamber 380. Match network 370 may comprise a number of electrical circuit elements, such as a number of switched capacitors, and other elements such as inductors, along with its own internal match network controller for switching switched capacitors and/or other elements at rapid response times in response to shocks and fluctuations in the load impedance of plasma chamber 380, which may contribute to configuring match network 370 to performing and implementing load impedance matching with plasma chamber 380. In other examples, RF generator 352 may comprise match network 370 as a component system within RF generator 352.

Sensor system 390 may comprise a variety of sensors, couplers, physical measurement equipment, and associated devices for receiving sensor inputs from match network 370 and plasma chamber 380. Sensor system 390 may thus collect and yield a high-bandwidth stream of data from match network 370 and plasma chamber 380. Sensor system 390 generates an output that is configured to be received as sensor signal input 312 by controller 300.

Setpoint control user interface 302 of controller 300 may be implemented to comprise a user multi-level pulsing setpoint input interface, in various examples. Setpoint control user interface 302 may be or may be comprised in an implementation of a user system as referenced above. Setpoint control user interface 302 may be configured to receive user inputs designating one or more system setpoints. Setpoint control user interface 302 may be configured to output one or more setpoint inputs 303 to controller 300.

Computing environment 307 may comprise one or more computing devices, in some examples. Computing environment 307 may comprise one or more computing devices configured to interface with one or more cloud computing resources, in some examples. Computing environment 307 may be configured to store, implement, and execute a digital twin, or other form of high-precision model, of the rest of plasma processing environment 301, including of each of the components and sub-components therein, as shown in FIG. 3. Computing environment 307 may comprise one or more general purpose computing devices and/or other computing environments for storing, processing, and executing a digital twin or other type of model reference that reproduces the functions of the rest of plasma processing environment 301 in high precision in software, as the target system to be controlled by controller 300, in some examples. Computing environment 307 may comprise cloud resources which may comprise applications, real and/or virtual servers, Docker containers, serverless functions, and/or other resources that are hosted on one or more cloud services, which may store, process, and execute the resources within functional specifications that are scalable, elastic, and geographically agnostic, among other advantageous characteristics, in some examples. Computing environment 307 may be configured to output one or more digital twin inputs 305 or other model reference inputs to controller 300. Controller 300 may be configured to implement, execute, and output a signum projection adaptation law output in accordance with various examples, such as the following.

Figure 4:
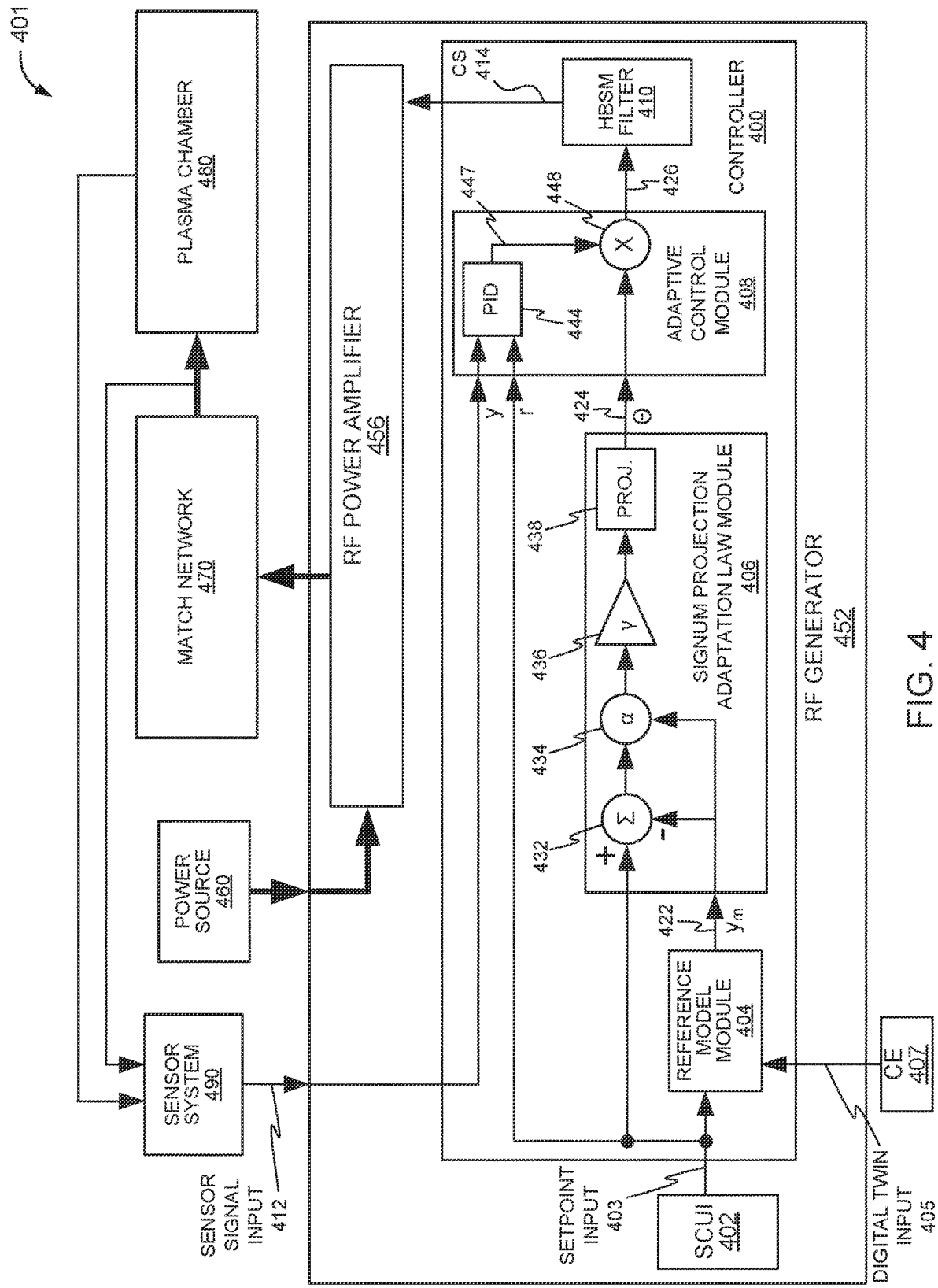
FIG. 4 illustrates an example plasma processing environment comprising a radio frequency (RF) generator that incorporates a controller, in accordance with aspects of the present disclosure.

FIG. 4 depicts an example plasma processing environment 401 comprising a radio frequency (RF) generator 452 that incorporates a controller 400 of this disclosure, in accordance with an illustrative example analogous in some ways to that of FIG. 3, incorporating a controller 400 analogous in some ways to controller 200 of FIG. 2, implemented as a component comprised in RF generator 452 and plasma processing environment 401, in accordance with an example implementation. Plasma processing environment 401 comprises RF generator 452, computing environment (CE) 407, power source 460, match network 470, plasma chamber 480, and sensor system 490, in this example. RF generator 452 comprises an RF power amplifier 456, controller 400, and a setpoint control user interface (SCUI) 402, in this example. Setpoint control user interface 402, computing environment 407, and sensor system 490 are all configured to generate outputs that are configured to be received as inputs by controller 400. Controller 400 may be configured to perform, execute, implement, or embody signum projection adaptation law control methods, systems, and techniques, as described herein, of plasma processing environment 401, as outputted, implemented, or expressed in a control signal 414, as described herein. Controller 400 may be a signum projection adaptation law controller, as described herein, in accordance with an illustrative example. Controller 400 comprises a reference model module 404, a signum projection adaptation law module 406 ("SPAL module 406"), an adaptive control module 408, and a hysteresis-based sliding mode filter 410 ("HBSM filter 410"), in this example.

Setpoint control user interface 402 enables a user to select control setpoints to input to controller 400. Setpoint control user interface 402 outputs setpoint input 403 to three separate components of controller 300: reference model module 404, signum projection adaptation law module 406, and adaptive control module 408. Setpoint control user interface 402 may thus be configured to output a setpoint control signal to reference model module 404, signum projection adaptation law module 406, and adaptive control module 408. Computing environment 407 is configured to store, implement, and execute a digital twin reference model of plasma processing environment 401, and outputs digital twin input 405 to reference model module 404 of controller 400. Computing environment 407 may thus be configured to output a reference model output, such as digital twin input 405, to reference model module 404. Sensor system 490 outputs sensor signal input 412 to adaptive control module 408 of controller 400, where sensor signal input 412 is based at least in part on data received from match network 470 and/or plasma chamber 480. Sensor signal input 412 may incorporate high-precision data from match network 470 and/or plasma chamber 480 at very high speed, such that controller 400 may receive information about the ongoing performance and behavior of match network 470 and/or plasma chamber 480 at very high speeds, e.g., within on the order of microseconds or nanoseconds of events occurring in match network 470 and/or plasma chamber 480.

Reference model module 404 receives setpoint input 403 and digital twin input 407, and outputs a reference model input 422 to signum projection adaptation law module 406. Signum projection adaptation law module 406 comprises modules 432, 434, 436, 438, as shown, and analogous to analogous modules described herein, and generates a signum projection tensor output 424. Adaptive control module 408 comprises PID module 444 and multiplication module 448. By performing its operations and generating its outputs in part based on sensor signal input 212 from an external sensor system, PID module 444 of adaptive control module 408 may adapt and update its outputs during operation of the external system based on measured performance of the external system, comprising RF power amplifier 456, match network 470, and plasma chamber 480, in this example. PID module 444 generates PID output 447, based on sensor signal input 412 from sensor system 490 and setpoint input 403 from setpoint control user interface 402. Adaptive control module 408 generates output 426 based on signum projection tensor input 424 and PID output 447. Hysteresis-based sliding mode filter 410 receives output 426 from adaptive control module 408, and outputs control signal 414. Controller 400 outputs control signal 414 from hysteresis-based sliding mode filter 410 to RF power amplifier 456 to control the operation of RF power amplifier 456. Hysteresis-based sliding mode filter 410 may thus be configured to output the filtered output as a control signal to RF power amplifier 456. The modules, components, operations, and signals comprised in and performed and generated by controller 400 may further be analogous at least in part to those described with reference to other examples herein.

Plasma processing environment 401 may thus comprise a plasma processing system that comprises RF power amplifier 456. RF power amplifier 456 may be configured to receive control signal 414 from hysteresis-based sliding mode filter 410, to receive power from power source 460, and to output RF power to a load, such as at least one of match network 470 and/or plasma chamber 480. Plasma processing environment 401 may thus comprise a plasma processing system or device or apparatus that comprises match network 470, plasma chamber 480, and sensor system 490, wherein the load comprises at least one of match network 470 and plasma chamber 480. Match network 470 may be configured to receive the RF power from RF power amplifier 456 and to output RF power to plasma chamber 480. Sensor system 490 may be configured to detect data from match network 470 and plasma chamber 480, and to generate the sensor system output to output as a sensor system input 412 to signum projection adaptation law module 406. (Throughout this application, any one device, module, or component may generate an output or output a signal, which may serve as an input and be inputted to another device, module, or component, such that "output," "signal," and "input" may be used interchangeably within the conditions indicated by context, where not otherwise made explicit.)

In signum projection adaptation law module 406, summation module 432 receives setpoint input 403 from user system 202, and reference model module output 422 from reference model module 404, and compares these two inputs to detect and output any detected error between the two as a measured error signal, to alpha module 434. Alpha module 434 receives the measured error signal from summation module 432 and the reference model module output 422 from reference model module 404, and generates an output to adaptive gain scaling module 436. Adaptive gain scaling module 436 performs an adaptive gain scaling on its input, and generates the resulting output to signum projection tensor module 438. Signum projection tensor module 438 receives this input and performs an on-line signum tensor parameter projection tensor operation as described herein on the input, and generates the result as signum projection parameter tensor output 424, which signum projection tensor module 438 outputs to adaptive control module 408. Signum projection adaptation law module 406 may thus be configured to receive the setpoint input 403, and to generate the signum projection adaptation law output 424 based at least in part on the setpoint input 403, as well as based at least in part on the reference model input 422.

Figure 5:
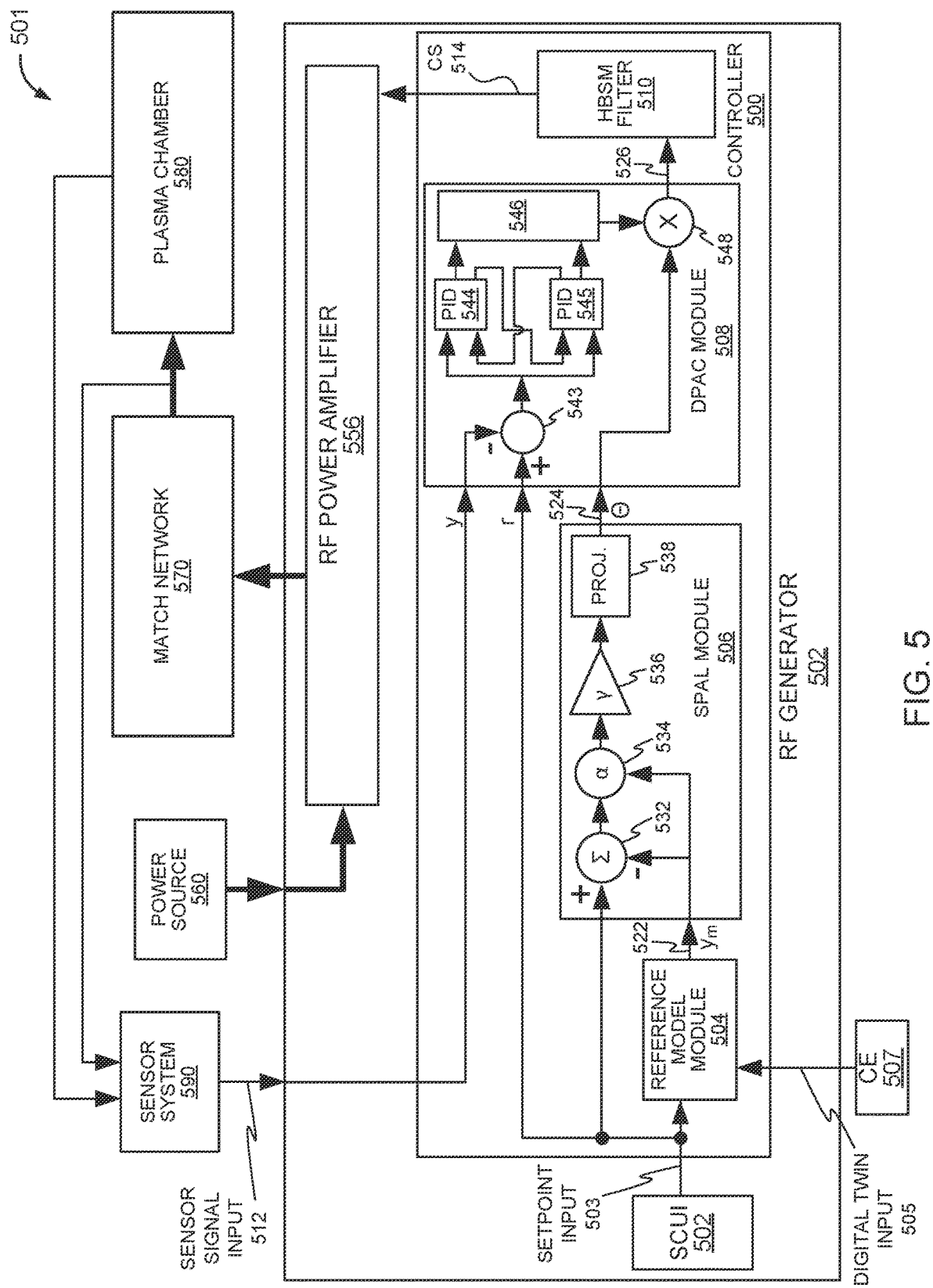
FIG. 5 illustrates an example plasma processing environment comprising a radio frequency (RF) generator that incorporates a controller, in accordance with aspects of the present disclosure.

FIG. 5 depicts a plasma processing environment 501 comprising a radio frequency (RF) generator 552 that incorporates a controller 500 of this disclosure, wherein controller 500 comprises a double-proportional-integral-derivative (double-PID) adaptive control (DPAC) module 508, which comprises two PID control modules 544, 545, in accordance with another illustrative example. Plasma processing environment 501 further comprises computing environment (CE) 507, power source 560, match network 570, plasma chamber 580, and sensor system 590; RF generator 502 comprises controller 500, setpoint control user interface (SCUI) 502, and RF power amplifier 556; controller 500 comprises reference model module 504, a signum projection adaptation law module 506 ("SPAL module 506"), double-PID adaptive control module 508, and a hysteresis-based sliding mode filter 510 ("HBSM filter 510"); setpoint control user interface 502 outputs setpoint input 503 to controller 500; computing environment 507 outputs digital twin input 505 to controller 500; controller 500 outputs control signal 514 to RF power amplifier 556; sensor system 590 outputs sensor signal input 512 to controller 500; and signum projection adaptation law module 506 comprises modules 532, 534, 536, and 538, all analogous at least in part to analogous components described elsewhere herein, at least other than as described differently, in accordance with various examples.

Double-PID adaptive control module 508 may contribute further novel advantages, in various examples. Double-PID adaptive control module 508 comprises a summation module 543, a first PID control module 544, a second PID control module 545, and a max module 546. First and second PID control modules 544, 545 may comprise bumpless transfer PID control modules, which may go into limiting loops, in this example. Summation module 543 acts as an initial summation module to both PID control modules 544, 545, and outputs its output to both PID control modules 544, 545. Summation module 543 may receive setpoint input 503 from setpoint control user interface 502, and sensor signal input 512 from sensor system 590. Summation module 543 may detect any error between setpoint input 503 and sensor signal input 512, and generate and output a measured error signal to first and second PID control modules 544, 545.

Each of first and second PID control modules 544, 545 outputs their respective outputs to max module 546 and as one of the two inputs to each other; that is, first PID control module 544 outputs its output as one of the inputs to second control PID module 545, and second PID control module 545 outputs its output as one of the inputs to first PID control module 544. Max module 546 compares the outputs from first and second PID control modules 544, 545, and outputs to module 548 either the output from first PID control module 544 or the output from second PID control module 545. In particular, max module 546 may output the output from first PID control module 544 if power levels indicated by the outputs from first and second PID control modules 544, 545 are rising from low to high, and max module 546 may output the output from second PID control module 545 if power levels indicated by the outputs from first and second PID control modules 544, 545 are descending from high to low.

Max module 546 outputs its output to module 548, which also receives signum projection tensor output 524 from signum projection adaptation law module 506. Module 548 multiplies signum projection tensor output 524 and the maxed double-PID output from max module 546, and outputs the resulting double-PID adaptive control module product output 526 to hysteresis-based sliding mode filter 510. Double-PID adaptive control module 508 may contribute to maximizing the performance of controller 500 without compromising stability, robustness, or repeatability, among other novel advantages, in various examples. In different examples, adaptive control module 508 may comprise two, three, four, five, six, or more PID controllers that correspond to adaptive gain scheduling, where the minimum number of PID controllers for multi-PID adaptive gain scheduling may be two (one for rising edge control and one for falling control). In some examples, the number of PID controllers may correspond to the maximum number of states in the systems to be controlled by controller 500. This may be more optimum and generalized, and may achieve higher performance and may minimize required implementation resources, as compared to various prior art adaptive rate mechanisms. In some examples using PID controllers, adaptive control module 508 may also comprise a gain scheduling PID control mechanism that uses lookup tables and changes the parameters of the lookup tables accordingly.

Thus, in various examples, an adaptive control module may comprise two or more PID control modules, and in the example of FIG. 5, double-PID adaptive control module 508 comprises a first PID controller 544 and a second PID controller 545, and further comprises a max module 546. Max module 546 is configured to receive a first PID output from first PID controller 544 and to receive a second PID output from second PID controller 545, and to output the first PID control module output in response to detecting a power level indicated by the outputs from the first and second PID control modules to be rising from low to high, and to output the second PID control module output in response to detecting the power level indicated by the outputs from the first and second PID control modules descending from high to low.

Control systems of this disclosure, comprising controllers 100, 200, 300, 400, and 500, among other examples, may go beyond adaptive control systems of the prior art in mitigating risks associated with hardware time and area restrictions, among other advantages. In addition, control systems of this disclosure may minimize the effects of cable length on the system's pointwise and/or instantaneous performance. Adaptive systems, methods, devices, and techniques of this disclosure may overcome performance and hardware limitations of prior art systems. Adaptive systems, methods, devices, and techniques of this disclosure may enable RF generators, comprising RF generators 352, 452, 552 of this disclosure, among other examples, to track a desired setpoint input in real-time instead of trying to carry out regulation through averaging, as in some prior art systems. A controller of this disclosure may use a highly efficient sliding mode adaptation law implementation, and may combine a sliding mode filter (e.g., sliding mode filters 210, 410, 510) with a signum projection adaptation law module (e.g., signum projection adaptation law modules 106, 206, 406, 506), which may enable accomplishing desired performance characteristics with a very low or minimal amount of hardware area and a very low or minimal amount of processing time (i.e. process at very high speed), and may contribute to guaranteeing robustness and repeatability, even in the face of disturbances on dynamic loads. In addition, a controller of this disclosure comprising a signum projection adaptation law module (e.g., signum projection adaptation law modules 106, 206, 406, 506) may successfully compensate for parameter drift and stability issues, in different examples. In some examples, a controller of this disclosure may store one or more versions of the signum projection tensor theta indexed to a corresponding set of load conditions, and in particular on a processing chip specialized for very fast performance, such as an FPGA, in some examples. Then if a controller of this disclosure at a later time detects the same load conditions, the controller may opt to initialize from the same signum projection tensor theta, potentially from a speed-specialized processing chip, such as an FPGA, in some examples, which may further enable very fast performance.

Figure 6:
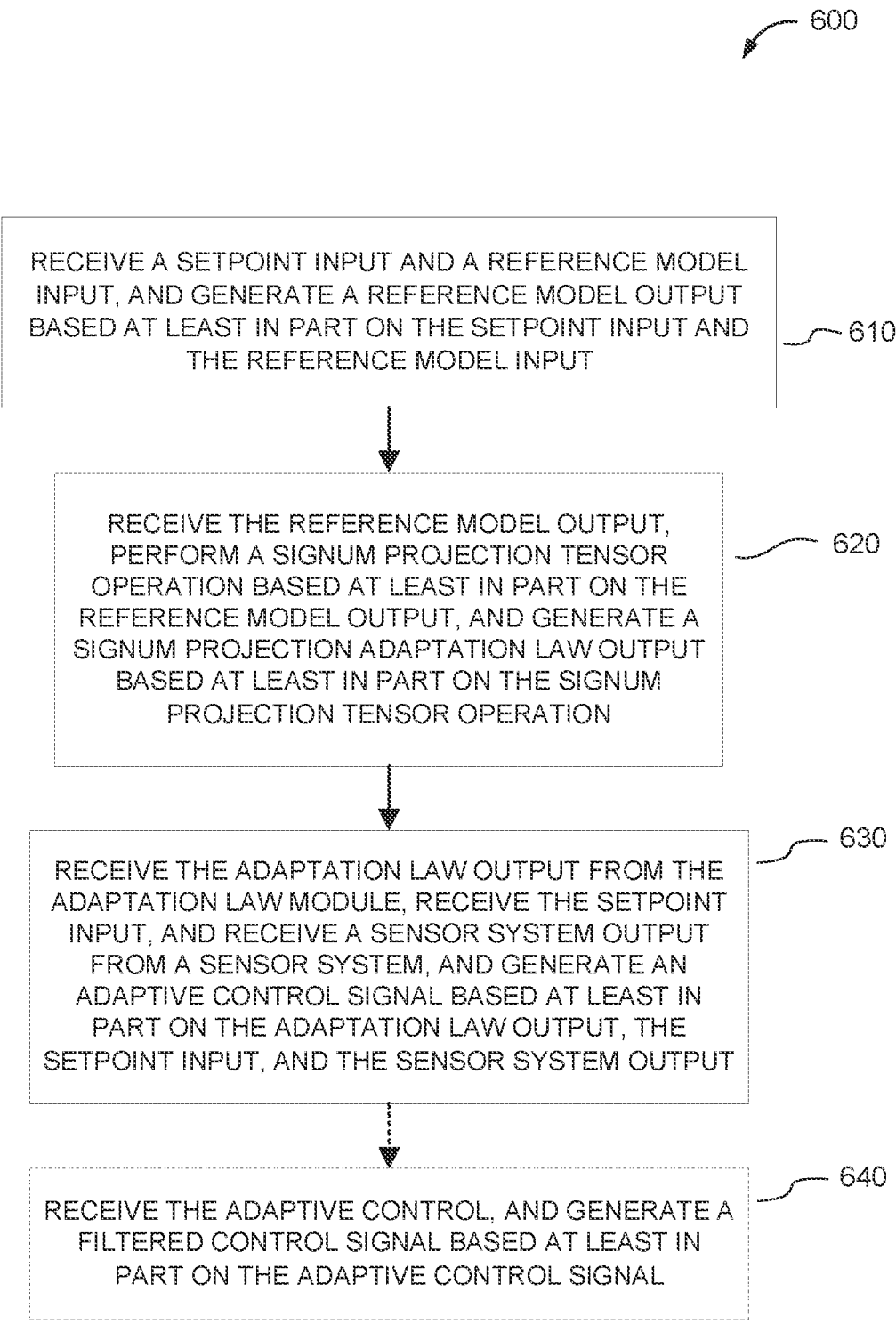
FIG. 6 illustrates a flowchart for an example method for operation of a controller, in another aspect of the present disclosure, in accordance with aspects of the present disclosure.

FIG. 6 depicts a flowchart for an example method 600 for operation of a controller, in another aspect of the present disclosure. Method 600 comprises receiving a setpoint input and a reference model input, and generating a reference model output, based at least in part on the setpoint input and the reference model input (610), which may be performed, executed, implemented, or embodied by a reference model module, for example. Method 600 further comprises receiving the reference model output, performing a signum projection tensor operation based at least in part on the reference model output, and generating a signum projection adaptation law output, based at least in part on the signum projection tensor operation (620), which may be performed, executed, implemented, or embodied by an adaptation law module, for example. Method 600 further comprises receiving the adaptation law output from the adaptation law module, receiving the setpoint input, and receiving a sensor system output from a sensor system, and generating an adaptive control signal based at least in part on the adaptation law output, the setpoint input, and the sensor system output (630), which may be performed, executed, implemented, or embodied by an adaptive control module, for example. In some examples, method 600 may also further comprise receiving the adaptive control, and generating a filtered control signal based at least in part on the adaptive control signal (640, depicted in dashed lines as optional in FIG. 6), which may be performed, executed, implemented, or embodied by a filter, for example. In some examples, generating the signum projection adaptation law output may comprise performing a signum projection tensor operation on an input based at least in part on the reference model output, wherein the signum projection adaptation law output is based at least in part on the signum projection tensor operation, wherein performing the signum projection tensor operation comprises performing a determination of a signum projection adaptation law output for a time k+1 in a form of the equation $$\Theta_{k+1} = Proj\left\{-\Gamma_k * \text{signum}\left(\frac{e_k - e_{k-1}}{\Theta_k - \Theta_{k-1}}\right) * \text{signum}(e_k)\right\}$$

(i.e. Equation 2), wherein $\Theta_{k+1}$ comprises a signum projection adaptation law output for a time k+1, $\Theta_k$ comprises a signum projection adaptation law output for a time k prior to the time k+1, $\Theta_{k-1}$ comprises a signum projection adaptation law output for a time k−1 prior to the time k, $\Gamma_k$ comprises an adaptive gain scaling learning factor tensor for the time k, $e_k$ comprises an error signal for the time k based at least in part on a detected error between the reference model output and the setpoint input for the time k, $e_{k-1}$ comprises an error signal for the time k−1 based at least in part on a detected error between the reference model output and the setpoint input for the time k−1, and the projection operator Proj performs a tensor projection operation. In various examples, each of the steps of method 600 may be performed, executed, implemented, or embodied by corresponding respective components of any of the examples shown in FIGS. 1-5 and described above.

Figure 7:
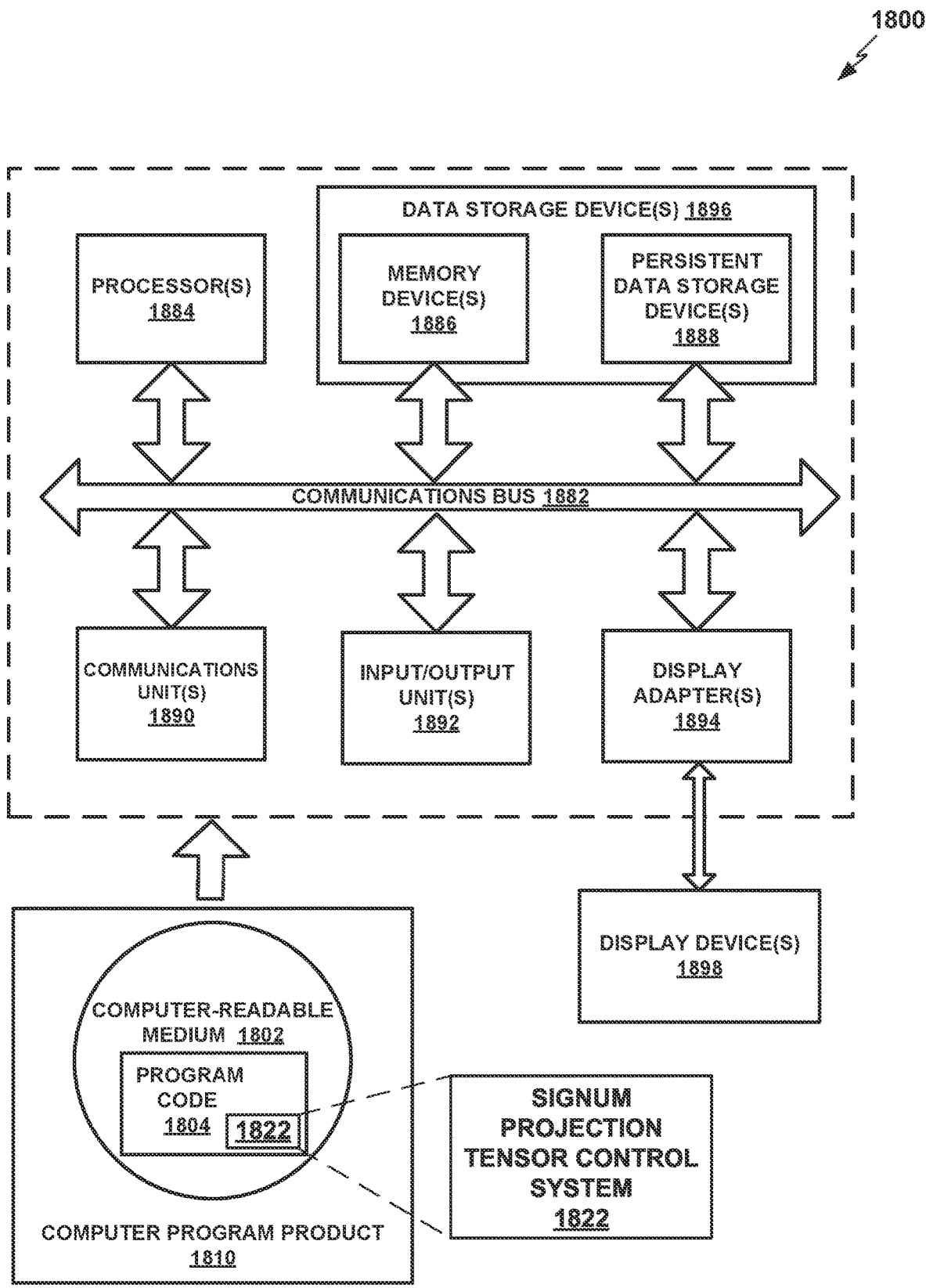
FIG. 7 illustrates a block diagram of an example computing system that may embody, control, perform, implement, or execute any of various examples of signum projection tensor control systems, devices, operations, methods, techniques in accordance with aspects of the present disclosure.

FIG. 7 depicts a block diagram of an example computing system 1800 that may embody, control, perform, implement, or execute any of various examples of signum projection tensor control systems, devices, operations, methods, techniques, and other systems, methods, and apparatus disclosed herein, in various examples of this disclosure. For example, computing system 1800 may serve as an example of any of controllers 100, 200, 300, 400, or 500 as depicted in FIGS. 1-5, respectively, and as described above with reference thereto. As further examples, computing system 1800 may perform, execute, or embody, implement, or execute method 600 as depicted in FIG. 6, and as described above with reference thereto, or any other methods described herein. Computing system 1800 may be a server such as a web server or an application server. Computing system 1800 may also be any server for providing a power recovery clamp application in various examples, including a virtual server that may be run from or incorporate any number of computing devices. A computing device may operate as all or part of a real or virtual server, and may be or incorporate a workstation, server, mainframe computer, notebook or laptop computer, desktop computer, tablet, smartphone, or other programmable data processing apparatus of any kind. Other implementations of a computing system 1800 may comprise a computer having capabilities or formats other than or beyond those described herein.

In the illustrative example of FIG. 7, computing system 1800 comprises communications bus 1882, which provides communications between one or more processor unit 1884, one or more memory device(s) 1886, one or more persistent data storage device(s) 1888, one or more communications unit(s) 1890, and one or more input/output (I/O) unit(s) 1892. Communications bus 1882 may comprise a dedicated system bus, a general system bus, multiple buses arranged in hierarchical form, any other type of bus, bus network, switch fabric, or other interconnection technology. Communications bus 1882 supports transfer of data, commands, and other information between various subsystems of computing system 1800.

Processor unit 1884 may be a programmable central processing unit (CPU) configured for executing programmed instructions stored in one or more memory device(s) 1886. In another illustrative example, processor unit 1884 may be implemented using one or more heterogeneous processor systems in which a main processor is present with secondary processors on a single chip. In another illustrative example, processor unit 1884 may be a symmetric multi-processor system containing multiple processors of the same type. Processor unit 1884 may be a reduced instruction set computing (RISC) microprocessor, an x86 compatible processor, or any other suitable processor. In various examples, processor unit 1884 may comprise a multi-core processor, for example. Processor unit 1884 may comprise multiple processing chips on one die, and/or multiple dies on one package or substrate, for example. Processor unit 1884 may also comprise one or more levels of integrated cache memory, for example. In various examples, processor unit 1884 may comprise one or more CPUs distributed across one or more locations.

Data storage 1896 comprises one or more memory device(s) 1886 and one or more persistent data storage device(s) 1888, which are in communication with processor unit 1884 through communications bus 1882. A memory device 1886 may comprise one or more random access semiconductor memory (RAM) devices for storing application data, i.e., computer program data, for processing. While memory device 1886 is depicted as a single monolithic block, in various examples, memory device 1886 may be arranged in a hierarchy of caches and in other memory devices, in a single physical location, or distributed across a plurality of physical systems in various forms. While memory device 1886 is depicted physically separated from processor unit 1884 and other elements of computing system 1800, memory device 1886 may refer equivalently to any intermediate, level, or cache memory at any location throughout computing system 1800, including cache memory proximate to or integrated with processor unit 1884 or individual cores of processor unit 1884.

A persistent data storage device 1888 may comprise one or more hard disc drives, solid state drives, flash drives, rewritable optical disc drives, magnetic tape drives, or any combination of these or other data storage media. Persistent data storage device 1888 may store computer-executable instructions or computer-readable program code for an operating system, application files comprising program code, data structures or data files, and any other type of data. These computer-executable instructions may be loaded from persistent data storage device 1888 into memory device 1886 to be read and executed by processor unit 1884 or other processors. Data storage 1896 may also comprise any other hardware elements capable of storing information, such as, for example and without limitation, data, program code in functional form, and/or other suitable information, either on a temporary basis and/or a permanent basis.

Persistent data storage device 1888 and memory device 1886 are examples of physical, tangible, non-transitory computer-readable data storage devices. Data storage 1896 may comprise any of various forms of volatile memory that may require being periodically electrically refreshed to maintain data in memory, while those skilled in the art will recognize that this also constitutes an example of a physical, tangible, non-transitory computer-readable data storage device. Executable instructions may be stored on a non-transitory medium when program code is loaded, stored, relayed, buffered, or cached on a non-transitory physical medium or device, including if only for only a short duration or only in a volatile memory format.

Processor unit 1884 can also be suitably programmed to read, load, and execute computer-executable instructions or computer-readable program code for a signum projection tensor control system 1822, as described in greater detail above. This program code may be stored on memory device 1886, persistent data storage device 1888, or elsewhere in computing system 1800. This program code may also take the form of executable program code 1804 stored on computer-readable medium 1802 comprised in computer program product 1810, and may be transferred or communicated, through any of a variety of local or remote means, from computer program product 1810 to computing system 1800 to be enabled to be executed by processor unit 1884, as further explained below.

The operating system may provide functions such as device interface management, memory management, and multiple task management. The operating system can be a Unix-based operating system, a non-Unix based operating system, a network operating system, a real-time operating system (RTOS), or any other suitable operating system. Processor unit 1884 can be suitably programmed to read, load, and execute instructions of the operating system.

A communications unit 1890, in this example, provides for communications with other computing or communications systems or devices. Communications unit 1890 may provide communications through the use of physical and/or wireless communications links. Communications unit 1890 may comprise a network interface card for interfacing with a local area network (LAN), an Ethernet adapter, a Token Ring adapter, a modem for connecting to a transmission system such as a telephone line, or any other type of communication interface. Communications unit 1890 may be used for operationally connecting many types of peripheral computing devices to computing system 1800, such as printers, bus adapters, and other computers. Communications unit 1890 may be implemented as an expansion card or be built into a motherboard, for example.

An input/output unit 1892 can support devices suited for input and output of data with other devices that may be connected to computing system 1800, such as keyboard, a mouse or other pointer, a touchscreen interface, an interface for a printer or any other peripheral device, a removable magnetic or optical disc drive (including CD-ROM, DVD-ROM, or Blu-Ray), a universal serial bus (USB) receptacle, or any other type of input and/or output device. Input/output unit 1892 may also comprise any type of interface for video output in any type of video output protocol and any type of monitor or other video display technology, in various examples. Some of these examples may overlap with each other, or with example components of communications unit 1890 or data storage 1896. Input/output unit 92 may also comprise appropriate device drivers for any type of external device, or such device drivers may reside elsewhere on computing system 1800 as appropriate.

Computing system 1800 also comprises a display adapter 1894 in this illustrative example, which provides one or more connections for one or more display devices, such as display device 1898, which may comprise any of a variety of types of display devices. Some of these examples may overlap with example components of communications unit 1890 or input/output unit 1892. Input/output unit 1892 may also comprise appropriate device drivers for any type of external device, or such device drivers may reside elsewhere on computing system 1800 as appropriate. Display adapter 1894 may comprise one or more video cards, one or more graphics processing units (GPUs), one or more video-capable connection ports, or any other type of data connector capable of communicating video data, in various examples. Display device 1898 may be any kind of video display device, such as a monitor, a television, or a projector, in various examples.

Input/output unit 1892 may comprise a drive, socket, or outlet for receiving computer program product 1810, which comprises a tangible, non-transitory computer-readable medium 1802 having executable program code 1804 stored thereon. For example, computer program product 1810 may be a CD-ROM, a DVD-ROM, a Blu-Ray disc, a magnetic disc, a USB stick, a flash drive, or an external hard disc drive, as illustrative examples, or any other suitable data storage technology.

Computer-readable medium 1802 may comprise any type of optical, magnetic, or other physical medium that physically encodes executable program code 1804 as a binary series of different physical states in each unit of memory that, when read by computing system 1800, induces a physical signal that is read by processor unit 1884 that corresponds to the physical states of the basic data storage elements of computer-readable medium 1802, and that induces corresponding changes to the physical state of processor unit 1884. That physical program code signal may be modeled or conceptualized as computer-readable instructions at any of various levels of abstraction, such as a high-level programming language, assembly language, or machine language, but ultimately constitutes a series of electrical and/or magnetic interactions that physically induce a change in the physical state of processor unit 1884, thereby physically reconfiguring processor unit 1884 and causing or configuring processor unit 1884 to generate physical outputs that correspond to the computer-executable instructions, in a way that causes computing system 1800 to physically assume new capabilities that it did not have until its physical state was changed by loading the executable instructions comprised in executable program code 1804.

In some illustrative examples, executable program code 1804 may be downloaded over a network to data storage 1896 from another device or computer system for use within computing system 1800. Executable program code 1804 comprising computer-executable instructions may be communicated or transferred to computing system 1800 from computer-readable medium 1802 through a hard-line or wireless communications link to communications unit 1890 and/or through a connection to input/output unit 1892. Computer-readable medium 1802 comprising executable program code 1804 may be located at a separate or remote location from computing system 1800, and may be located anywhere, including at any remote geographical location anywhere in the world or in orbit, and may relay executable program code 1804 to computing system 1800 over any type of one or more communication links, such as the Internet and/or other packet data networks. Executable program code 1804 may be transmitted over a wireless Internet connection, or over a shorter-range direct wireless connection such as wireless LAN, Bluetooth™, Wi-Fi™, or an infrared connection, for example. Any other wireless or remote communication protocol may also be used in other implementations.

The communications link and/or the connection may comprise wired and/or wireless connections in various illustrative examples, and executable program code 1804 may be transmitted from a source computer-readable medium 1802 over non-tangible media, such as communications links or wireless transmissions containing the executable program code 1804. Executable program code 1804 may be more or less temporarily or durably stored on any number of intermediate tangible, physical computer-readable devices and media, such as any number of physical buffers, caches, main memory, or data storage components of servers, gateways, network nodes, mobility management entities, or other network assets, en route from its original source medium to computing system 1800.

Various example examples of this disclosure may be in the form of a system, a method, and/or a computer program product. The computer program product may comprise a computer readable storage medium (or media) having computer readable program instructions thereon for causing a processor to carry out aspects of examples of this disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium comprises the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including object-oriented programming languages such as C++ or Java; imperative programming languages, such as C; a specialized language such as hardware description language (HDL); Lisp programming languages, such as Common Lisp, Racket, or Clojure; other functional programming languages, such as Haskell or Erlang; or multi-paradigm languages, such as Python or Rust. The computer readable program instructions may execute entirely on a user's computer, partly on a user's computer, as a stand-alone software package, partly on a user's computer and partly on one or more remote computers or servers, or entirely on one or more remote computers or servers. In the latter scenario, a remote computer or server may be connected to a user's computer through any type of network, including a local area network (LAN) or a wide area network (WAN), or the connection may be made to an external computer (for example, through the Internet using an Internet Service Provider (ISP)). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of examples of this disclosure.

Aspects of the present invention are described herein with reference to flowchart illustrations and/or block diagrams of methods, apparatus (systems), and computer program products according to examples of the invention. Each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function and/or act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions, acts, or steps specified in the flowchart and/or block diagram block or blocks.

The flowchart and block diagrams in the figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur in a different order than that noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, may also be implemented by special purpose hardware-based systems that perform the specified functions or acts or carry out combinations of special purpose hardware and computer instructions.

Those of skill would further appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons in the relevant fields of art may implement the described functionality in varying ways for each particular application, but such implementation decisions should not be interpreted as causing a departure from the scope of the present disclosure, which may comprise all of such varying implementations.

The various illustrative logical blocks, modules, and circuits described in connection with the examples disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 8:
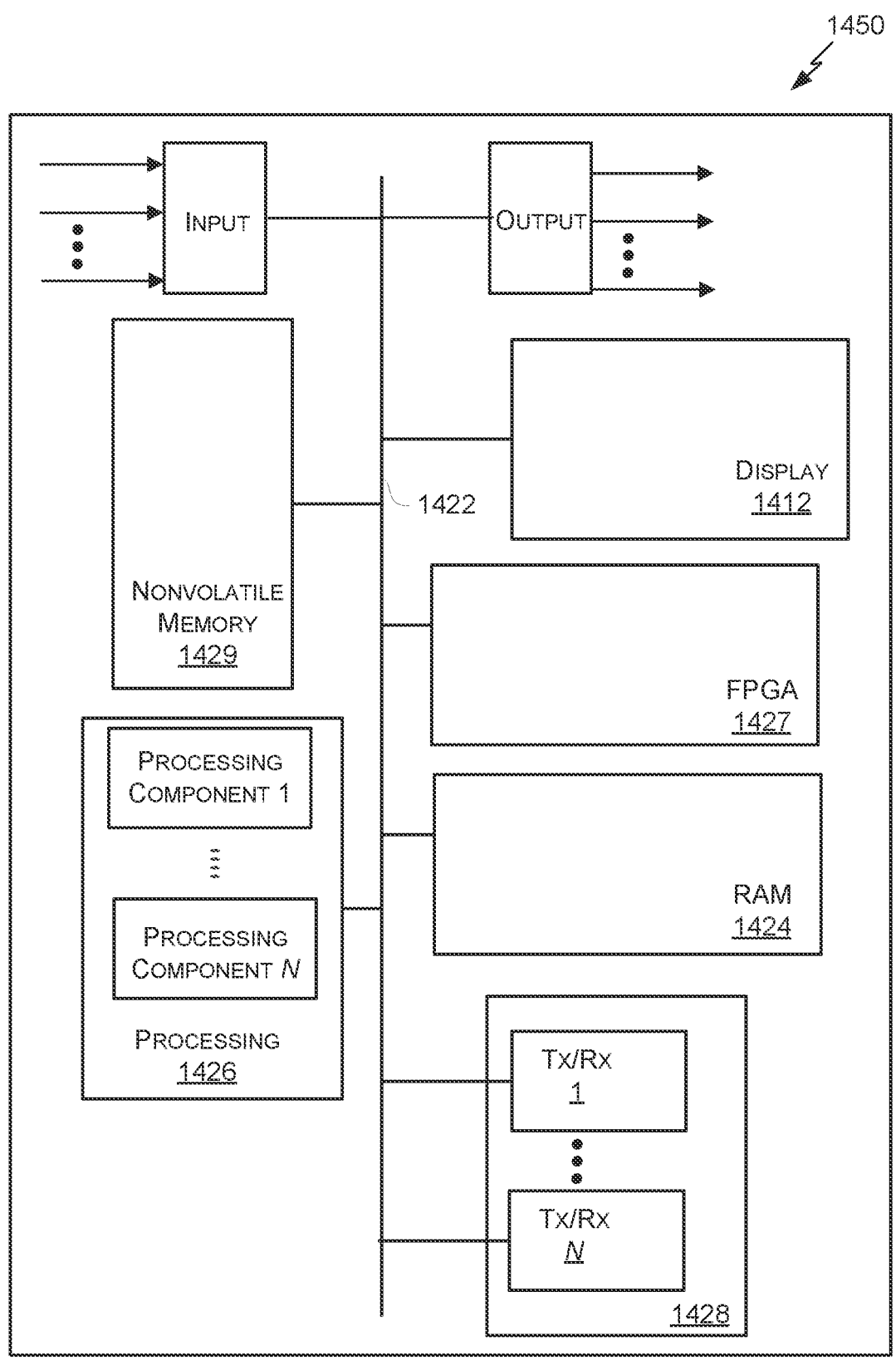
FIG. 8 illustrates a conceptual block diagram of a system comprising example physical components that may perform, execute, or embody one or more aspects of various examples of a signum projection tensor control device or system, in accordance with aspects of the present disclosure.

FIG. 8 depicts a conceptual block diagram of a system 1450 comprising example physical components that may perform, execute, or embody one or more aspects of various examples of a signum projection tensor control device or system, and other devices, systems, methods, techniques, and apparatus disclosed herein. As shown, in this example a display 1412 and nonvolatile memory 1429 are coupled to a bus 1422 that is also coupled to random access memory ("RAM") 1424, a processing portion (which comprises N processing components) 1426, a field programmable gate array (FPGA) 1427, and a transceiver component 1428 that comprises N transceivers. Although the components depicted in FIG. 8 represent physical components, FIG. 8 is not intended to be a detailed hardware diagram; thus, many of the components depicted in FIG. 8 may be realized by common constructs or distributed among additional physical components. Moreover, it is contemplated that other existing and yet-to-be developed physical components and architectures may be utilized to implement the functional components described with reference to FIG. 8.

A display 1412 generally operates to provide a user interface for a user, and in several implementations, the display 1412 is realized by a touchscreen display. For example, display 1412 can be used to control and interact with the components described herein. In general, the nonvolatile memory 1429 may comprise one or more non-transitory memory devices, components, or systems that may function to store (e.g., persistently store) data and machine-readable (e.g., processor-executable) code (comprising executable code that is associated with effectuating methods described herein). In some examples, for example, the nonvolatile memory 1429 may comprise bootloader code, operating system code, file system code, and/or non-transitory processor-executable code to facilitate the execution of the methods described herein.

In many implementations, the nonvolatile memory 1429 may be implemented as flash memory (e.g., NAND or ONENAND memory), or as other types of memory devices, components, or systems. While code may be executed from the nonvolatile memory 1429, the executable code in the nonvolatile memory may typically be loaded into RAM 1424 and executed by one or more of the N processing components in the processing portion 1426.

In operation, the N processing components in connection with RAM 1424 may generally operate to execute the instructions stored in nonvolatile memory 1429 to realize the functionality of signum projection tensor control devices, systems, methods, techniques, and apparatus as described herein. For example, non-transitory processor-executable instructions to effectuate the methods described herein may be persistently stored in nonvolatile memory 1429 and executed by the N processing components in connection with RAM 1424. The processing portion 1426 may comprise a video processor, digital signal processor (DSP), graphics processing unit (GPU), and other processing components.

In addition, or in the alternative, the field programmable gate array (FPGA) 1427 may be configured to effectuate or implement one or more aspects of the methodologies described herein. For example, non-transitory FPGA-configuration-instructions may be persistently stored in nonvolatile memory 1429 and accessed by the FPGA 1427 (e.g., during boot up) to configure the FPGA 1427.

The input component may operate to receive signals (e.g., from a setpoint control user interface, a computing environment, and/or a sensor system associated with a signum projection tensor controller such as controllers 100, 200, 300, 400, and/or 500 as described above) that may be indicative of setpoint control signals, reference models, measurement data from a match network and/or a plasma chamber, and/or other applicable signals. The output component may generally operate to provide one or more analog or digital signals (e.g., to output a control signal, or to generate and/or output other signals or outputs as described herein) to effectuate or implement operational aspects of a signum projection tensor control device, or other system described herein.

The depicted transceiver component 1428 comprises N transceiver chains, which may be used for communicating with external devices (e.g., external controllers) via wireless or wireline networks. N may be any number of 1 or more, in different examples. Each of the N transceiver chains may represent a transceiver associated with a particular communication scheme (e.g., WiFi, Ethernet, Profibus, etc.).

Method 600 and/or other methods as described herein may comprise other steps or variations in various other examples. Some or all of any of method 600 and/or other methods as described herein may be performed by or embodied in hardware, and/or performed or executed by a controller, a CPU, an FPGA, a system on chip (SoC), a measurement and control multi-processor system on chip (MPSoC), which may comprise both a CPU and an FPGA, and/or other elements together in one integrated SoC, and/or other processing device or computing device processing executable instructions, in controlling other associated hardware, devices, systems, or products in executing, implementing, or embodying various subject matter of any of the respective method 600 and/or other methods as described herein.

Devices, systems, methods, apparatus, and techniques for signum projection tensor control are thus shown and described herein, in various foundational aspects and in various selected illustrative applications, architectures, techniques, and methods for signum projection tensor model reference adaptive control. Those persons skilled in the relevant arts will be well-equipped by this disclosure with an understanding and an informed reduction to practice of a wide panoply of further applications, architectures, techniques, and methods for signum projection tensor model reference adaptive control encompassed by the present disclosure and by the claims set forth below.

As used herein, the recitation of "at least one of A, B and C" is intended to mean "either A, B, C or any combination of A, B and C." The previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not limited to the embodiments, examples, and aspects described and shown herein, but is to be accorded the widest scope consistent with the principles and novel features disclosed herein, and with the claims recited below.

The present disclosure and many of its attendant advantages will be understood by the foregoing description, and various changes may be made in the form, construction, and arrangement of the components without departing from the disclosed subject matter or without sacrificing all of its material advantages. The forms, aspects, examples, and embodiments described and shown herein are merely explanatory, and the following claims encompass and comprise a wide range of forms, aspects, examples, and embodiments encompassing any such changes. While the present disclosure has been described with reference to various examples, it will be understood that these examples are illustrative and that the scope of the disclosure is not limited to them. Many variations, modifications, and additions are possible within the scope of the examples of the disclosure. More generally, examples in accordance with the present disclosure have been described in the context of particular implementations. Functionality may be separated or combined in blocks differently in various examples of the disclosure or described with different terminology. These and other variations, modifications, additions, and improvements may fall within the scope of the disclosure as defined in the claims that follow.

What is claimed is:

1. A device comprising:
a reference model module, configured to receive a setpoint input and a reference model input, and to generate a reference model output based at least in part on the setpoint input and the reference model input;
an adaptation law module, configured to receive the reference model output from the reference model module, to perform a signum projection tensor operation based at least in part on the reference model output, and to generate a signum projection adaptation law output, based at least in part on the signum projection tensor operation; and
an adaptive control module, configured to receive the signum projection adaptation law output from the adaptation law module, to receive the setpoint input, and to receive a sensor system output from a sensor system, and to generate an adaptive control signal based at least in part on the signum projection adaptation law output, the setpoint input, and the sensor system output.

2. The device of claim 1, wherein the adaptation law module comprises a signum projection tensor module configured to perform the signum projection tensor operation based at least in part on the reference model output.

3. The device of claim 2, wherein performing the signum projection tensor operation comprises performing a determination of a signum projection adaptation law output for a time k+1 in a form of the equation $$\Theta_{k+1} = Proj\left\{-\Gamma_k * \text{signum}\left(\frac{e_k - e_{k-1}}{\Theta_k - \Theta_{k-1}}\right) * \text{signum}(e_k)\right\}$$

wherein $\Theta_{k+1}$ comprises a signum projection adaptation law output for a time k+1, $\Theta_k$ comprises a signum projection adaptation law output for a time k prior to the time k+1, $\Theta_{k-1}$ comprises a signum projection adaptation law output for a time k−1 prior to the time k, $\Gamma_k$ comprises an adaptive gain scaling learning factor tensor for the time k, $e_k$ comprises an error signal for the time k based at least in part on a detected error between the reference model output and the setpoint input for the time k, $e_{k-1}$ comprises an error signal for the time k−1 based at least in part on a detected error between the reference model output and the setpoint input for the time k−1, and the projection operator Proj performs a tensor projection operation.

4. The device of claim 1, further comprising a filter, configured to receive the adaptive control signal from the adaptive control module, and to generate a filtered control signal based at least in part on the adaptive control signal.

5. The device of claim 4, wherein the filter comprises a hysteresis-based sliding mode filter.

6. The device of claim 4, wherein the filter is configured to output the filtered control signal to a radio frequency (RF) power amplifier.

7. The device of claim 1, wherein the adaptation law module is further configured to receive the setpoint input, and to generate the signum projection adaptation law output based also at least in part on the setpoint input.

8. The device of claim 1, wherein the adaptive control module comprises a gain parametrized control module.

9. The device of claim 1, wherein the adaptive control module comprises one or more proportional-integral-derivative (PID) control modules.

10. The device of claim 1, wherein the adaptive control module comprises a first PID control module and a second PID control module, and further comprises a max module, wherein the max module is configured to receive a first PID output from the first PID controller and to receive a second PID output from the second PID controller, and to output the first PID control module output in response to detecting a power level indicated by the outputs from the first and second PID control modules to be rising from low to high, and to output the second PID control module output in response to detecting the power level indicated by the outputs from the first and second PID control modules descending from high to low.

11. The device of claim 1, further comprising a setpoint control user interface configured to output a setpoint control signal to the reference model module.

12. The device of claim 1, further comprising a computing environment configured to output a reference model output to the reference model module.

13. The device of claim 1, further comprising:
a filter configured to output a filtered control signal based at least in part on the adaptive control signal, and
a radio frequency (RF) power amplifier, configured to receive the filtered control signal from the filter, to receive power from a power source, and to output RF power to a load.

14. The device of claim 13, further comprising a match network, a plasma chamber, and the sensor system, wherein the load comprises at least one of the match network and the plasma chamber, wherein the match network is configured to receive the RF power from the RF power amplifier and to output RF power to the plasma chamber, and wherein the sensor system is configured to detect data from the match network and the plasma chamber, and to generate the sensor system output to output to the adaptive control module.

15. A method comprising:
receiving, by a control device, a setpoint input and a reference model input, and generating a reference model output, based at least in part on the setpoint input and the reference model input;
receiving, by the control device, the reference model output, performing a signum projection tensor operation based at least in part on the reference model output, and generating a signum projection adaptation law output, based at least in part on the signum projection tensor operation; and
receiving, by the control device, the signum projection adaptation law output from the adaptation law module, receiving the setpoint input, and receiving a sensor system output from a sensor system, and generating an adaptive control signal based at least in part on the signum projection adaptation law output, the setpoint input, and the sensor system output.

16. The method of claim 15, further comprising receiving the adaptive control, and generating a filtered control signal based at least in part on the adaptive control signal.

17. The method of claim 15, wherein generating the signum projection adaptation law output comprises performing the signum projection tensor operation based at least in part on the reference model output, wherein performing the signum projection tensor operation comprises performing a determination of a signum projection adaptation law output for a time k+1 in a form of the equation $$\Theta_{k+1} = Proj\left\{-\Gamma_k * \text{signum}\left(\frac{e_k - e_{k-1}}{\Theta_k - \Theta_{k-1}}\right) * \text{signum}(e_k)\right\} \quad 5$$

wherein $\Theta_{k+1}$ comprises a signum projection adaptation law output for a time k+1, $\Theta_k$ comprises a signum projection adaptation law output for a time k prior to the time k+1, $\Theta_{k-1}$ comprises a signum projection adaptation law output for a time k−1 prior to the time k, $\Gamma_k$ comprises an adaptive gain scaling learning factor tensor for the time k, $e_k$ comprises an error signal for the time k based at least in part on a detected error between the reference model output and the setpoint input for the time k, $e_{k-1}$ comprises an error signal for the time k−1 based at least in part on a detected error between the reference model output and the setpoint input for the time k−1, and the projection operator Proj performs a tensor projection operation.

18. A computing system comprising:
one or more processing devices, one or more tangible computer-readable memory devices, and one or more tangible computer-readable data storage devices;
program instructions, stored on the one or more data storage devices for execution by the one or more processing devices using the one or more memory devices, for receiving, by a control device, a setpoint input and a reference model input, and generating a reference model output, based at least in part on the setpoint input and the reference model input;
program instructions, stored on the one or more data storage devices for execution by the one or more processing devices using the one or more memory devices, for receiving, by the control device, the reference model output, performing a signum projection tensor operation based at least in part on the reference model output, and generating a signum projection adaptation law output, based at least in part on the signum projection tensor operation; and program instructions, stored on the one or more data storage devices for execution by the one or more processing devices using the one or more memory devices, for receiving, by the control device, the signum projection adaptation law output from the adaptation law module, receiving the setpoint input, and receiving a sensor system output from a sensor system, and generating an adaptive control signal based at least in part on the signum projection adaptation law output, the setpoint input, and the sensor system output.

19. The computing system of claim 18, further comprising program instructions for receiving the adaptive control, and generating a filtered control signal based at least in part on the adaptive control signal.

20. The computing system of claim 18, wherein the program instructions for generating the signum projection adaptation law output comprise program instructions for performing the signum projection tensor operation based at least in part on the reference model output, wherein performing the signum projection tensor operation comprises performing a determination of a signum projection adaptation law output for a time k+1 in a form of the equation $$\Theta_{k+1} = Proj\left\{-\Gamma_k * \text{signum}\left(\frac{e_k - e_{k-1}}{\Theta_k - \Theta_{k-1}}\right) * \text{signum}(e_k)\right\}$$

wherein $\Theta_{k+1}$ comprises a signum projection adaptation law output for a time k+1, $\Theta_k$ comprises a signum projection adaptation law output for a time k prior to the time k+1, $\Theta_{k-1}$ comprises a signum projection adaptation law output for a time k−1 prior to the time k, $\Gamma_k$ comprises an adaptive gain scaling learning factor tensor for the time k, $e_k$ comprises an error signal for the time k based at least in part on a detected error between the reference model output and the setpoint input for the time k, $e_{k-1}$ comprises an error signal for the time k−1 based at least in part on a detected error between the reference model output and the setpoint input for the time k−1, and the projection operator Proj performs a tensor projection operation.

* * * * *